United States Patent
Pala et al.

(10) Patent No.: US 10,950,719 B2
(45) Date of Patent: Mar. 16, 2021

(54) SEMINCONDUCTOR DEVICE WITH SPREADING LAYER

(71) Applicant: Cree, Inc., Durham, NC (US)

(72) Inventors: Vipindas Pala, Morrisville, NC (US); Lin Cheng, Chapel Hill, NC (US); Anant Kumar Agarwal, Arlington, VA (US); John Williams Palmour, Cary, NC (US); Edward Robert Van Brunt, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/255,405

(22) Filed: Apr. 17, 2014

(65) Prior Publication Data

US 2015/0084062 A1 Mar. 26, 2015

Related U.S. Application Data

(63) Continuation of application No. 14/032,718, filed on Sep. 20, 2013.

(51) Int. Cl.
*H01L 29/78* (2006.01)
*H01L 29/08* (2006.01)
(Continued)

(52) U.S. Cl.
CPC ........ *H01L 29/7806* (2013.01); *H01L 21/046* (2013.01); *H01L 21/26506* (2013.01);
(Continued)

(58) Field of Classification Search
CPC ............. H01L 29/7804; H01L 29/7805; H01L 29/7806; H01L 29/7818; H01L 29/7819;
(Continued)

(56) References Cited

U.S. PATENT DOCUMENTS 4,126,900 A 11/1978 Koomen et al.
4,803,533 A * 2/1989 Chang ................. H01L 21/2253
257/345

(Continued)

FOREIGN PATENT DOCUMENTS

CN 1729577 A 2/2006
EP 0748520 A1 12/1996
(Continued)

OTHER PUBLICATIONS

Jang, T. et al., "Electrical Characteristics of Tantalum and Tantalum Carbide Schottky Diodes on n- and p-type Silicon Carbide as a Function of Temperature," Presented at the High Temperature Electronics Conference, Jun. 14-18, 1998, Albuquerque, NM, IEEE, pp. 280-286.

(Continued)

*Primary Examiner* — Stephen M Bradley
(74) *Attorney, Agent, or Firm* — Withrow & Terranova, P.L.L.C.

(57) ABSTRACT

A vertical field-effect transistor (FET) device includes a monolithically integrated bypass diode connected between a source contact and a drain contact of the vertical FET device. According to one embodiment, the vertical FET device includes a pair of junction implants separated by a junction field-effect transistor (JFET) region. At least one of the junction implants of the vertical FET device includes a deep well region that is shared with the integrated bypass diode, such that the shared deep well region functions as both a source junction in the vertical FET device and a junction barrier region in the integrated bypass diode. The vertical FET device and the integrated bypass diode may include a substrate, a drift layer over the substrate, and a spreading layer over the drift layer, such that the junction implants of the vertical FET device are formed in the spreading layer.

26 Claims, 23 Drawing Sheets

(51) Int. Cl.
  *H01L 29/66* (2006.01)
  *H01L 21/04* (2006.01)
  *H01L 21/265* (2006.01)
  *H01L 29/10* (2006.01)
  *H01L 29/06* (2006.01)
  *H01L 29/861* (2006.01)
  *H01L 29/16* (2006.01)
  *H01L 29/872* (2006.01)
  *H01L 29/47* (2006.01)
  *H01L 29/36* (2006.01)

(52) U.S. Cl.
  CPC ...... *H01L 29/0878* (2013.01); *H01L 29/1095* (2013.01); *H01L 29/66068* (2013.01); *H01L 29/66734* (2013.01); *H01L 29/782* (2013.01); *H01L 29/7813* (2013.01); *H01L 29/7828* (2013.01); *H01L 29/0619* (2013.01); *H01L 29/1608* (2013.01); *H01L 29/36* (2013.01); *H01L 29/47* (2013.01); *H01L 29/8611* (2013.01); *H01L 29/872* (2013.01)

(58) Field of Classification Search
  CPC ............... H01L 29/872; H01L 29/8611; H01L 29/0619; H01L 29/1608; H01L 29/47; H01L 21/046; H01L 29/1095; H01L 29/66734; H01L 29/782; H01L 21/26506; H01L 29/0878; H01L 29/66068; H01L 29/7813; H01L 29/7828; H01L 29/36
  See application file for complete search history.

(56) References Cited

U.S. PATENT DOCUMENTS

| | | | |
|---|---|---|---|
| 4,967,243 A | 10/1990 | Baliga et al. | |
| 5,111,253 A | 5/1992 | Korman et al. | |
| 5,241,195 A | 8/1993 | Tu et al. | |
| 5,365,102 A | 11/1994 | Mehrotra et al. | |
| 5,378,911 A | 1/1995 | Murakami | |
| 5,536,977 A | 7/1996 | Williams | |
| 5,661,314 A * | 8/1997 | Merrill | H01L 29/66333 257/144 |
| 5,674,766 A | 10/1997 | Darwish et al. | |
| 5,689,144 A | 11/1997 | Williams | |
| 5,886,383 A | 3/1999 | Kinzer | |
| 5,973,367 A | 10/1999 | Williams | |
| 6,057,558 A | 5/2000 | Yamamoto et al. | |
| 6,239,463 B1 | 5/2001 | Williams et al. | |
| 6,700,175 B1 * | 3/2004 | Kodama | H01L 29/0634 257/302 |
| 6,979,863 B2 | 12/2005 | Ryu | |
| 7,221,010 B2 | 5/2007 | Ryu | |
| 7,498,633 B2 | 3/2009 | Cooper et al. | |
| 7,592,647 B2 | 9/2009 | Nakata et al. | |
| 7,923,320 B2 | 4/2011 | Ryu | |
| 8,178,920 B2 | 5/2012 | Nakamura et al. | |
| 8,283,973 B2 | 10/2012 | Hashimoto et al. | |
| 8,415,671 B2 | 4/2013 | Zhang | |
| 8,492,827 B2 | 7/2013 | Ryu | |
| 8,575,692 B2 | 11/2013 | Yang et al. | |
| 8,686,439 B2 * | 4/2014 | Takahashi | H01L 29/1608 |
| 9,331,197 B2 | 5/2016 | Pala et al. | |
| 10,192,960 B2 * | 1/2019 | Wada | H01L 29/1095 |
| 2002/0038891 A1 * | 4/2002 | Ryu | H01L 21/049 257/350 |
| 2002/0047124 A1 | 4/2002 | Kitabatake | |
| 2002/0125541 A1 | 9/2002 | Korec et al. | |
| 2003/0006452 A1 | 1/2003 | Challa | |
| 2003/0040144 A1 | 2/2003 | Blanchard et al. | |
| 2003/0080355 A1 | 5/2003 | Shirai et al. | |
| 2003/0178672 A1 | 9/2003 | Hatakeyama et al. | |
| 2003/0214011 A1 * | 11/2003 | Jianjun | H01L 29/1095 257/500 |
| 2004/0099905 A1 | 5/2004 | Baliga | |
| 2004/0195618 A1 | 10/2004 | Saito et al. | |
| 2004/0212011 A1 | 10/2004 | Ryu | |
| 2004/0251503 A1 | 12/2004 | Hayashi et al. | |
| 2005/0035398 A1 | 2/2005 | Williams et al. | |
| 2005/0045960 A1 | 3/2005 | Takahashi | |
| 2005/0082611 A1 | 4/2005 | Peake et al. | |
| 2005/0253190 A1 | 11/2005 | Okumura et al. | |
| 2006/0192256 A1 | 8/2006 | Cooper et al. | |
| 2006/0202264 A1 | 9/2006 | Bhalla et al. | |
| 2006/0214221 A1 | 9/2006 | Challa et al. | |
| 2007/0012983 A1 | 1/2007 | Yang et al. | |
| 2007/0034901 A1 | 2/2007 | Lui et al. | |
| 2007/0045655 A1 | 3/2007 | Song et al. | |
| 2007/0096237 A1 | 5/2007 | Zhao et al. | |
| 2007/0120201 A1 | 5/2007 | Yamaguchi et al. | |
| 2007/0145414 A1 | 6/2007 | Francis et al. | |
| 2007/0235745 A1 | 10/2007 | Hayashi et al. | |
| 2008/0012026 A1 | 1/2008 | Tsuji | |
| 2008/0029812 A1 * | 2/2008 | Bhalla | H01L 29/0878 257/330 |
| 2008/0050876 A1 | 2/2008 | Matocha et al. | |
| 2008/0105949 A1 | 5/2008 | Zhang et al. | |
| 2008/0128850 A1 | 6/2008 | Goerlach et al. | |
| 2008/0142811 A1 | 6/2008 | Matocha et al. | |
| 2008/0149963 A1 | 6/2008 | Adan | |
| 2008/0197439 A1 | 8/2008 | Goerlach et al. | |
| 2008/0206941 A1 | 8/2008 | Okuno et al. | |
| 2008/0230787 A1 * | 9/2008 | Suzuki | H01L 29/0623 |
| 2008/0308838 A1 | 12/2008 | McNutt et al. | |
| 2009/0057757 A1 | 3/2009 | Hokomoto et al. | |
| 2009/0065814 A1 | 3/2009 | Bhalla et al. | |
| 2009/0072242 A1 | 3/2009 | Zhang | |
| 2009/0078971 A1 * | 3/2009 | Treu | H01L 29/0843 257/263 |
| 2009/0079001 A1 | 3/2009 | Salih et al. | |
| 2009/0090920 A1 | 4/2009 | Endo et al. | |
| 2009/0146154 A1 | 6/2009 | Zhang et al. | |
| 2009/0173949 A1 | 7/2009 | Yatsuo et al. | |
| 2009/0179297 A1 | 7/2009 | Stewart et al. | |
| 2009/0189228 A1 | 7/2009 | Zhang et al. | |
| 2009/0218621 A1 | 9/2009 | Pfirsch et al. | |
| 2009/0230500 A1 | 9/2009 | Yoshikawa et al. | |
| 2009/0236612 A1 | 9/2009 | Nakamura et al. | |
| 2009/0272983 A1 * | 11/2009 | Kumar | H01L 29/66666 |
| 2009/0278197 A1 | 11/2009 | Ohta et al. | |
| 2009/0283776 A1 | 11/2009 | Iwamuro | |
| 2009/0283798 A1 | 11/2009 | Tsuzuki et al. | |
| 2010/0013007 A1 | 1/2010 | Miyakoshi | |
| 2010/0025693 A1 * | 2/2010 | Malhan | H01L 29/063 257/76 |
| 2010/0073039 A1 | 3/2010 | Kanai et al. | |
| 2010/0078710 A1 | 4/2010 | Willmeroth et al. | |
| 2010/0093116 A1 * | 4/2010 | Fronheiser | H01L 22/12 438/16 |
| 2010/0176443 A1 | 7/2010 | Takaishi | |
| 2010/0219417 A1 * | 9/2010 | Miura | H01L 29/0615 257/77 |
| 2010/0270586 A1 | 10/2010 | Ueno | |
| 2011/0049564 A1 | 3/2011 | Guan et al. | |
| 2011/0156810 A1 | 6/2011 | Girdhar et al. | |
| 2011/0193057 A1 | 8/2011 | Sabathil et al. | |
| 2011/0241068 A1 | 10/2011 | Watanabe et al. | |
| 2011/0254088 A1 * | 10/2011 | Darwish | H01L 29/407 257/340 |
| 2012/0025874 A1 | 2/2012 | Saikaku et al. | |
| 2012/0037955 A1 | 2/2012 | Hirler et al. | |
| 2012/0088339 A1 | 4/2012 | Molin et al. | |
| 2012/0187419 A1 | 7/2012 | Elpelt et al. | |
| 2012/0236615 A1 | 9/2012 | Kitabatake | |
| 2012/0256195 A1 | 10/2012 | Aketa | |
| 2012/0280258 A1 | 11/2012 | Yeh et al. | |
| 2012/0292742 A1 | 11/2012 | Itoh et al. | |
| 2012/0306009 A1 * | 12/2012 | Kim | H01L 27/0629 257/334 |
| 2012/0313212 A1 * | 12/2012 | Sugawara | H01L 29/0615 257/471 |
| 2013/0026493 A1 | 1/2013 | Cheng et al. | |

(56) References Cited

U.S. PATENT DOCUMENTS

| | | | |
|---|---|---|---|
| 2013/0026568 A1* | 1/2013 | Bhalla | H01L 29/66712 257/337 |
| 2013/0105889 A1* | 5/2013 | Fujiwara | H01L 29/66068 257/330 |
| 2013/0153995 A1 | 6/2013 | Misawa et al. | |
| 2013/0306983 A1* | 11/2013 | Nakano | H01L 29/0623 257/76 |
| 2013/0313635 A1* | 11/2013 | Nakano | H01L 21/8213 257/330 |
| 2013/0341674 A1 | 12/2013 | Werber et al. | |
| 2014/0021484 A1* | 1/2014 | Siemieniec | H01L 21/049 257/77 |
| 2014/0027781 A1 | 1/2014 | Ryu | |
| 2014/0048847 A1 | 2/2014 | Yamashita et al. | |
| 2014/0070268 A1 | 3/2014 | Yoshimura et al. | |
| 2014/0077311 A1 | 3/2014 | Simin et al. | |
| 2014/0117376 A1 | 5/2014 | Terano et al. | |
| 2014/0203299 A1 | 7/2014 | Aketa et al. | |
| 2014/0252554 A1 | 9/2014 | Liao | |
| 2015/0041886 A1 | 2/2015 | Pala et al. | |
| 2015/0053920 A1 | 2/2015 | Yeh et al. | |
| 2016/0211360 A1 | 7/2016 | Pala et al. | |

FOREIGN PATENT DOCUMENTS

| | | |
|---|---|---|
| EP | 0867943 A1 | 9/1998 |
| EP | 1576672 A2 | 9/2005 |
| FR | 2814855 A1 | 4/2002 |
| JP | S5742164 A | 3/1982 |
| JP | S6149474 A | 3/1986 |
| JP | H065867 A | 1/1994 |
| JP | 2007184434 A | 7/2007 |
| JP | 2012114104 A | 6/2012 |
| JP | 2013149837 A | 8/2013 |
| KR | 10-1020344 B1 | 3/2011 |
| TW | I330894 B | 9/2010 |
| WO | 2012137914 A1 | 10/2012 |
| WO | 2013014943 A2 | 1/2013 |

OTHER PUBLICATIONS

International Search Report and Written Opinion for International Patent Application No. PCT/US2014/056098, dated Nov. 21, 2014, 16 pages.
International Search Report and Written Opinion for International Patent Application No. PCT/US2014/056091, dated Feb. 16, 2015, 15 pages.
International Search Report and Written Opinion for International Patent Application No. PCT/US2014/056093, dated Feb. 18, 2015, 15 pages.
International Search Report and Written Opinion for International Patent Application No. PCT/US2014/056094, dated Feb. 18, 2015, 14 pages.
Non-Final Office Action for U.S. Appl. No. 14/032,718, dated Apr. 16, 2015, 18 pages.
Non-Final Office Action for U.S. Appl. No. 14/032,919, dated Jun. 1, 2015, 19 pages.
Non-Final Office Action for U.S. Appl. No. 14/032,995, dated May 11, 2015, 13 pages.
Baliga, B. Jayant, "Advanced Power Rectifier Concepts," First Edition, 2009, Springer Science + Business Media, LLC, pp. 29 and 72.
Baliga, B. Jayant, "Fundamentals of Power Semiconductor Devices," Second Edition, 2008 Springer US, p. 168.
Baliga, B. Jayant, "Advanced Power MOSFET Concepts," 2010, Springer Science + Business Media, LLC, Chapters 2, 3, and 8, pp. 23-117, 399-476.
Agarwal, A. et al., "A New Degradation Mechanism in High-Voltage SiC Power MOSFETs," IEEE Electron Device Letters, vol. 28, No. 7, Jul. 2007, pp. 587-589.
Author Unknown, "The Industry's First SiC Power Mosfet with Internal SiC SBD Significantly Reduces Power Loss in Inverters and Requires Fewer Components," ROHM Semiconductor Website—Press Releases, Jul. 11, 2012, 3 pages, http://www.rohm.com/web/global/news-detail?news-title=the-industry-s-first%E2%80%BB-sic-power-mosfet-with-internal-sic-sbd&defaultGroupId=false.
Author Unknown, "NextPowerS3 MOSFETs Offer Super-Fast Switching with Soft Recovery," PowerPulse.Net, Copyright: 2013, 3 pages, www.powerpulse.net/story.php?storyID=28455;s=091820131.
Baliga, B. Jayant, "Chapter 8: Integral Diode," Advanced Power MOSFET Concepts, Copyright: 2010, pp. 399-476, Springer Science+Business Media, LLC, London, England.
Bhatnagar, M. et al., "Effect of Surface Inhomogeneities on the Electrical Characteristics of SiC Schottky Contacts," IEEE Trans. Electron Devices, vol. 43, No. 1, Jan. 1996, pp. 150-156.
Advisory Action for U.S. Appl. No. 14/032,718, dated Feb. 9, 2016, 5 pages.
Advisory Action for U.S. Appl. No. 14/032,919, dated Feb. 22, 2016, 5 pages.
Corrected Notice of Allowability for U.S. Appl. No. 14/032,995, dated Feb. 8, 2016, 5 pages.
Final Office Action for U.S. Appl. No. 14/032,718, dated Oct. 23, 2015, 21 pages.
Final Office Action for U.S. Appl. No. 14/032,919, dated Dec. 3, 2015, 11 pages.
Notice of Allowance for U.S. Appl. No. 14/032,995, dated Nov. 25, 2015, 11 pages.
Non-Final Office Action for U.S. Appl. No. 14/255,611, dated Nov. 2, 2015, 18 pages.
Office Action and Search Report for Taiwanese Patent Application No. 103132520, dated Dec. 28, 2015, 11 pages.
International Preliminary Report on Patentability for International Patent Application No. PCT/US2014/056091, dated Mar. 31, 2016, 11 pages.
International Preliminary Report on Patentability for International Patent Application No. PCT/US2014/056093, dated Mar. 31, 2016, 12 pages.
International Preliminary Report on Patentabilty for International Patent Application No. PCT/US2014/056094, dated Mar. 31, 2016, 11 pages.
International Preliminary Report on Patentability for International Patent Application No. PCT/US2014/056098, dated Mar. 31, 2016, 10 pages.
Non-Final Office Action for U.S. Appl. No. 14/032,718, dated Jul. 1, 2016, 21 pages.
Non-Final Office Action for U.S. Appl. No. 14/032,919, dated Jul. 29, 2016, 18 pages.
Final Office Action for U.S. Appl. No. 14/255,611, dated Jul. 5, 2016, 12 pages.
Advisory Action and AFCP 2.0 Decision for U.S. Appl. No. 14/032,718, dated Mar. 29, 2016, 6 pages.
Corrected Notice of Allowability for U.S. Appl. No. 14/032,995, dated Mar. 15, 2016, 6 pages.
Sheng, K et al., "A Vertical SiC JFET with Monolithically Integrated JBS Diode," 21st International Symposium on Power Semiconductor Devices & IC's (ISPSD), Jun. 14-18, 2009, IEEE, pp. 255-258.
Zhu Lin et al., "Analytical Modeling of High-Voltage 4H—SiC Junction Barrier Schottky (JBS) Rectifiers," IEEE Transactions on Electron Devices, vol. 55, Issue 8, Aug. 8, 2008, IEEE, pp. 1857-1863.
Notice of Allowance for U.S. Appl. No. 15/087,406, dated Mar. 10, 2017, 9 pages.
Final Office Action for U.S. Appl. No. 14/032,919, dated Feb. 7, 2017, 24 pages.
Sui, Y., et al., "On-State Characteristics of SiC power UMOSFETs on 115-μm drift Layers," Electron Device Letters, vol. 26, Issue 4, Apr. 2005, IEEE, pp. 255-257.
Wang, S.R. et al., "Double-Self-Aligned Short-Channel Power DMOSFETs in 4H—SiC," Device Research Conference, Jun. 22-24, 2009, University Park, PA, IEEE, pp. 277-278.

(56) References Cited

OTHER PUBLICATIONS

Non-Final Office Action for U.S. Appl. No. 13/962,295, dated Jul. 17, 2014, 8 pages.
Non-Final Office Action for U.S. Appl. No. 13/962,295, dated Dec. 18, 2014, 11 pages.
Final Office Action for U.S. Appl. No. 13/962,295, dated Jul. 23, 2015, 12 pages.
Advisory Action for U.S. Appl. No. 13/962,295, dated Oct. 30, 2015, 3 pages.
Notice of Allowance for U.S. Appl. No. 13/962,295, dated Dec. 22, 2015, 7 pages.
Non-Final Office Action for U.S. Appl. No. 15/087,406, dated Aug. 15, 2016, 26 pages.
Office Action and Search Report for Taiwanese Patent Application No. 103127134, dated Oct. 22, 2015, 15 pages.
Decision of Allowance for Taiwanese Patent Application No. 103127134, dated Feb. 26, 2016, 10 pages.
International Search Report and Written Opinion for PCT/US2014/049941, dated Oct. 22, 2014, 12 pages.
International Preliminary Report on Patentability for PCT/US2014/049941, dated Feb. 18, 2016, 8 pages.
Final Office Action for U.S. Appl. No. 14/032,718, dated Jan. 6, 2017, 21 pages.
Advisory Action for U.S. Appl. No. 14/255,611, dated Sep. 16, 2016, 4 pages.
Non-Final Office Action for U.S. Appl. No. 14/255,611, dated Nov. 10, 2016, 15 pages.
Notice of Reasons for Rejection for Japanese Patent Application No. 2016-533399, dated Aug. 22, 2017, 12 pages.
Advisory Action for U.S. Appl. No. 14/255,611, dated Sep. 28, 2017, 6 pages.
Advisory Action for U.S. Appl. No. 14/032,718, dated Apr. 14, 2017, 6 pages.
Advisory Action for U.S. Appl. No. 14/032,919, dated Apr. 21, 2017, 5 pages.
Non-Final Office Action for U.S. Appl. No. 14/032,919, dated Jul. 6, 2017, 15 pages.
Final Office Action for U.S. Appl. No. 14/255,611, dated Jun. 29, 2017, 19 pages.
Non-Final Office Action for U.S. Appl. No. 14/032,718, dated Apr. 9, 2018, 17 pages.
Advisory Action for U.S. Appl. No. 14/032,919, dated Apr. 16, 2018, 6 pages.
Non-Final Office Action for U.S. Appl. No. 14/255,611, dated Mar. 29, 2018, 14 pages.
Decision to Grant a Patent for Japanese Patent Application No. 2016-533399, dated Feb. 6, 2018, 4 pages.
Second Office Action for Chinese Patent Application No. 201480044619.0, dated May 2, 2018, 18 pages.
First Office Action for Chinese Patent Application No. 201480044619.0, dated Nov. 1, 2017, 10 pages.
Final Office Action for U.S. Appl. No. 14/032,919, dated Jan. 25, 2018, 16 pages.
Final Office Action for U.S. Appl. No. 14/032,718, dated Nov. 26, 2018, 16 pages.
Advisory Action for U.S. Appl. No. 14/032,718, dated Feb. 8, 2019, 5 pages.
Examination Report for European Patent Application No. 14752742.8, dated Jan. 4, 2019, 5 pages.
Non-Final Office Action for U.S. Appl. No. 15/970,148, dated Feb. 28, 2019, 14 pages.
Decision on Rejection for Chinese Patent Application No. 201480044619.0, dated Jan. 22, 2019, 15 pages.
Third Office Action for Chinese Patent Application No. 201480044619.0, dated Sep. 13, 2018, 15 pages.
Non-Final Office Action for U.S. Appl. No. 14/032,919, dated Sep. 27, 2018, 17 pages.
Final Office Action for U.S. Appl. No. 14/255,611, dated Nov. 2, 2018, 12 pages.
Final Office Action for U.S. Appl. No. 15/970,148, dated Jul. 23, 2019, 15 pages.
Non-Final Office Action for U.S. Appl. No. 14/032,718, dated Jul. 3, 2019, 13 pages.
Final Office Action for U.S. Appl. No. 14/032,919, dated May 29, 2019, 14 pages.
Notice of Reasons for Rejection for Japanese Patent Application No. 2018-041765, dated Jun. 25, 2019, 10 pages.
Notice of Allowance for U.S. Appl. No. 15/970,148, dated Nov. 8, 2019, 8 pages.
Notice of Allowance for U.S. Appl. No. 14/032,919, dated Aug. 23, 2019, 12 pages.
Notice of Reexamination for Chinese Patent Application No. 201480044619.0, dated Sep. 10, 2019, 14 pages.
Final Office Action for U.S. Appl. No. 14/032,718, dated Jan. 24, 2020, 14 pages.
Decision to Grant for Japanese Patent Application No. 2018-041765, dated Dec. 10, 2019, 4 pages.
Advisory Action and AFCP 2.0 Decision for U.S. Appl. No. 14/032,718, dated Mar. 26, 2020, 5 pages.
Non-Final Office Action for U.S. Appl. No. 14/032,718, dated Apr. 30, 2020, 13 pages.
Non-Final Office Action for U.S. Appl. No. 15/970,148, dated Apr. 17, 2020, 8 pages.
Decision of Reexamination for Chinese Patent Application No. 201480044619.0, dated Apr. 14, 2020, 30 pages.
Notice of Allowance for U.S. Appl. No. 15/970,148, dated Aug. 5, 2020, 8 pages.
Notice of Allowance for U.S. Appl. No. 14/032,718, dated Aug. 19, 2020, 7 pages.
Intention to Grant for European Patent Application No. 14752742.8, dated Nov. 10, 2020, 7 pages.

* cited by examiner

US 10,950,719 B2

SEMINCONDUCTOR DEVICE WITH SPREADING LAYER

RELATED APPLICATIONS

The present application is a continuation of U.S. patent application Ser. No. 14/032,718, which was filed on Sep. 20, 2013, the disclosure of which is incorporated herein by reference in its entirety. The present application is related to U.S. patent application Ser. No. 14/255,611, filed Apr. 17, 2014, entitled "SEMICONDUCTOR DEVICE WITH A CURRENT SPREADING LAYER," which is incorporated herein by reference in its entirety.

FIELD OF THE DISCLOSURE

The present disclosure relates to power transistors including an integrated bypass diode.

BACKGROUND

Power transistor devices are often used to transport large currents and support high voltages. One example of a power transistor device is the power metal-oxide-semiconductor field-effect transistor (MOSFET). A power MOSFET has a vertical structure, wherein a source contact and a gate contact are located on a first surface of the MOSFET device that is separated from a drain contact by a drift layer formed on a substrate. Vertical MOSFETs are sometimes referred to as vertical diffused MOSFETs (VDMOS) or double-diffused MOSFETs (DMOSFETs). Due to their vertical structure, the voltage rating of a power MOSFET is a function of the doping level and thickness of the drift layer. Accordingly, high voltage power MOSFETs may be achieved with a relatively small footprint.

FIG. 1 shows a conventional power MOSFET device 10. The conventional power MOSFET device 10 includes an N-doped substrate 12, an N-doped drift layer 14 formed over the substrate 12, one or more junction implants 16 in the surface of the drift layer 14 opposite the substrate 12, and an N-doped junction gate field-effect transistor (JFET) region 18 between each one of the junction implants 16. Each one of the junction implants 16 is formed by an ion implantation process, and includes a P-doped deep well region 20, a P-doped base region 22, and an N-doped source region 24. Each deep well region 20 extends from a corner of the drift layer 14 opposite the substrate 12 downwards towards the substrate 12 and inwards towards the center of the drift layer 14. The deep well region 20 may be formed uniformly or include one or more protruding regions. Each base region 22 is formed vertically from the surface of the drift layer 14 opposite the substrate 12 down towards the substrate 12 along a portion of the inner edge of each one of the deep well regions 20. Each source region 24 is formed in a shallow portion on the surface of the drift layer 14 opposite the substrate 12, and extends laterally to overlap a portion of the deep well region 20 and the base region 22, without extending over either. The JFET region 18 defines a channel width 26 between each one of the junction implants 16.

A gate oxide layer 28 is positioned on the surface of the drift layer 14 opposite the substrate 12, and extends laterally between a portion of the surface of each source region 24, such that the gate oxide layer 28 partially overlaps and runs between the surface of each source region 24 in the junction implants 16. A gate contact 30 is positioned on top of the gate oxide layer 28. Two source contacts 32 are each positioned on the surface of the drift layer 14 opposite the substrate 12 such that each one of the source contacts 32 partially overlaps both the source region 24 and the deep well region 20 of one of the junction implants 16, respectively, and does not contact the gate oxide layer 28 or the gate contact 30. A drain contact 34 is located on the surface of the substrate 12 opposite the drift layer 14.

As will be appreciated by those of ordinary skill in the art, the structure of the conventional power MOSFET device 10 includes a built-in anti-parallel body diode between the source contacts 32 and the drain contact 34 formed by the junction between each one of the deep well regions 20 and the drift layer 14. The built-in anti-parallel body diode may negatively impact the performance of the conventional power MOSFET device 10 by impeding the switching speed of the device, as will be discussed in further detail below.

In operation, when a biasing voltage below the threshold voltage of the device is applied to the gate contact 30 and the junction between each deep well region 20 and the drift layer 14 is reverse biased, the conventional power MOSFET device 10 is placed in an OFF state. In the OFF state of the conventional power MOSFET device 10, any voltage between the source contacts 32 and the drain contact 34 is supported by the drift layer 14. Due to the vertical structure of the conventional power MOSFET device 10, large voltages may be placed between the source contacts 32 and the drain contact 34 without damaging the device.

FIG. 2A shows operation of the conventional power MOSFET device 10 when the device is in an ON state (first quadrant) of operation. When a positive voltage is applied to the drain contact 34 of the conventional power MOSFET device 10 relative to the source contacts 32 and the gate voltage increases above the threshold voltage of the device, an inversion layer channel 36 is formed at the surface of the drift layer 14 underneath the gate contact 30, thereby placing the conventional power MOSFET device 10 in an ON state. In the ON state of the conventional power MOSFET device 10, current (shown by the shaded region in FIG. 2) is allowed to flow from the drain contact 34 to each one of the source contacts 32 in the device. An electric field presented by junctions formed between the deep well region 20, the base region 22, and the drift layer 14 constricts current flow in the JFET region 18 into a JFET channel 38 having a JFET channel width 40. At a certain spreading distance 42 from the inversion layer channel 36 when the electric field presented by the junction implants 16 is diminished, the flow of current is distributed laterally, or spread out in the drift layer 14, as shown in FIG. 2. The JFET channel width 40 and the spreading distance 42 determine the internal resistance of the conventional power MOSFET device 10, thereby dictating the performance of the device. A conventional power MOSFET device 10 generally requires a channel width 26 of three microns or wider in order to sustain an adequate JFET channel width 40 and spreading distance 42 for proper operation of the device.

FIG. 2B shows operation of the conventional power MOSFET device 10 when the device is operating in the third quadrant. When a voltage below the threshold voltage of the device is applied to the gate contact 28 of the conventional power MOSFET device 10 and a positive voltage is applied to the source contacts 32 relative to the drain contact 34 of the device, current will flow from the source contacts 32 through each respective deep well region 26 and into the drift layer 14. In other words, current will flow through each built-in anti-parallel body diode in the conventional power MOSFET device 10.

As discussed above, a built-in anti-parallel body diode is located between the source contacts 32 and the drain contact 34 of the conventional power MOSFET device 10. Specifically, the built-in anti-parallel body diode is formed by the P-N junction between each one of the P-doped deep well regions 26 and the N-doped drift layer 14. The built-in anti-parallel body diode is a relatively slow minority carrier device. Accordingly, once the built-in anti-parallel body diode is activated in a forward bias mode of operation, majority carriers may linger in the device even after a biasing voltage is no longer present at the gate contact 30 of the conventional power MOSFET device 10. The time it takes the majority carriers of the built-in anti-parallel body diode to recombine in their respective regions is known as the reverse recovery time. During the reverse recovery time of the built-in anti-parallel body diode, the lingering majority carriers may prevent the conventional power MOSFET device 10 from entering an OFF state of operation by allowing current to flow from the drain contact 34 to the source contacts 32. The switching speed of the conventional power MOSFET device 10 may therefore be limited by the reverse recovery time of the built-in anti-parallel body diode.

Conventional solutions to the switching speed ceiling imposed by the built-in anti-parallel body diode have focused on placing an external high-speed bypass diode between the source contact and the drain contact of a power MOSFET device. FIG. 3 shows the conventional power MOSFET device 10 connected to an external bypass diode 44. As will be appreciated by those of ordinary skill in the art, the external bypass diode 44 may be chosen to be a junction barrier Schottky (JBS) diode, because of the low forward voltage, low leakage current, and negligible reverse recovery time afforded by such a device. The external bypass diode includes an anode 46, a cathode 48, a drift layer 50, and one or more junction barrier implants 52. The anode 46 of the external bypass diode 44 is coupled to the source contacts 32 of the conventional power MOSFET device 10. The cathode 48 of the external bypass diode 44 is coupled to the drain contact 34 of the conventional power MOSFET device 10. The anode 46 and the cathode 48 are separated from one another by the drift layer 50. The junction barrier implants 52 are located on the surface of the drift layer 50 in contact with the anode 46, and are laterally separated from one another.

As will be appreciated by those of ordinary skill in the art, the JBS diode combines the desirable low forward voltage of a Schottky diode with the low reverse leakage current of a traditional P-N junction diode. In operation, when a bias voltage below the threshold voltage of the conventional power MOSFET device 10 is applied to the gate contact 30 of the device and the junction between each deep well region 20 and the drift layer 14 is reverse biased, the conventional power MOSFET device 10 is placed in an OFF state and the external bypass diode 44 is placed in a reverse bias mode of operation. In the reverse bias mode of operation of the external bypass diode 44, each one of the P-N junctions formed between the drift layer 50 and the junction barrier implants 52 of the external bypass diode 44 is also reverse biased. Each reverse biased junction generates an electric field that effectively expands to occupy the space between each one of the junction barrier implants 52. The resulting depletion region pinches off any reverse leakage current present in the device.

FIG. 4A shows operation of the conventional power MOSFET device 10 including the external bypass diode 44 when the conventional power MOSFET device 10 is in an ON state (first quadrant) of operation. When a positive voltage is applied to the drain contact 34 of the conventional power MOSFET device 10 relative to the source contacts 32 and the gate voltage increases above the threshold voltage, an inversion layer channel 36 is formed at the surface of the drift layer 14 underneath the gate contact 30, thereby placing the conventional power MOSFET device 10 in an ON state (first quadrant) of operation and placing the external bypass diode 44 in a reverse bias mode of operation. In the ON state (first quadrant) of operation of the conventional power MOSFET device 10, current flows in a substantially similar manner to that shown in FIG. 2A. Additionally, because the external bypass diode 44 is reverse biased, current does not flow from through the device.

FIG. 4B shows operation of the conventional power MOSFET device 10 including the external bypass diode 44 when the conventional power MOSFET device 10 is operating in the third quadrant, and the external bypass diode 44 is operating in a forward bias mode of operation. When a bias voltage below the threshold voltage of the conventional power MOSFET 10 is applied to the gate contact 30, and a positive voltage is applied to the source contacts 32 relative to the drain contact 34, the conventional power MOSFET 10 begins to operate in the third quadrant, and the external bypass diode 44 is placed in a forward bias mode of operation. In the forward bias mode of operation of the external bypass diode 44, current (shown by the shaded region in FIG. 4) will flow from the anode 46 through one or more channels 54 in the drift layer 50, each one of the channels 54 having a channel width 56 determined by an electric field generated between each one of the junction barrier implants 52 and the drift layer 50. At a certain spreading distance 58 from the anode 46 of the external bypass diode 44, the electric field presented by the junction between each one of the junction barrier implants 52 and the drift layer 50 becomes less pronounced, and the current spreads out laterally to fill the drift layer 50. Finally, the current is delivered to the cathode 48 of the external bypass diode 44. Although the external bypass diode 44 creates a low impedance path for current flow between the source contacts 32 and the drain contact 34, a small amount of current may still flow through the conventional power MOSFET device 10, as shown in FIG. 4B.

By creating a high-speed, low-impedance path for current flow around the built-in anti-parallel body diode, only a small number of majority carriers accumulate in the built-in anti-parallel body diode when the conventional power MOSFET device 10 is operated in the third quadrant. By reducing the number of majority carriers accumulated in the device, the reverse recovery time of the built-in anti-parallel body diode can be substantially reduced. Accordingly, the switching time of the conventional power MOSFET device 10 is no longer limited by the reverse recovery time of the built-in anti-parallel body diode.

Although effective at lifting the switching speed ceiling imposed by the built-in anti-parallel body diode of the conventional power MOSFET device 10, the external bypass diode 44 may increase the ON state resistance as well as the parasitic capacitance of the conventional power MOSFET device 10, thereby degrading the performance of the device. Additionally, the external bypass diode 44 will consume valuable real estate in a device in which the conventional power MOSFET device 10 is integrated.

Accordingly, there is a need for a power MOSFET device with a high switching speed, a low ON state resistance, a low parasitic capacitance, and a compact form factor.

SUMMARY

The present disclosure relates to a vertical field-effect transistor (FET) device including a monolithically integrated bypass diode, which is connected between a source contact and a drain contact of the vertical FET device. According to one embodiment, the vertical FET device includes a pair of junction implants separated by a junction field-effect transistor (JFET) region. At least one of the junction implants of the vertical FET device includes a deep well region that forms a junction barrier region in the integrated bypass diode. The vertical FET device and the integrated bypass diode may include a substrate, a drift layer over the substrate, and a spreading layer over the drift layer, such that the junction implants of the vertical FET device are formed in the spreading layer.

By sharing the at least one deep well region of the vertical FET device with the integrated bypass diode, valuable real estate in the vertical FET/integrated bypass diode device is saved. Further, by sharing the spreading layer between the vertical FET and the integrated bypass diode, the ON state resistance of each device and width of each device can be simultaneously reduced. Finally, the spreading layer may lower the forward voltage drop across the diode and reduce the leakage current of the device, thereby improving the performance of the vertical FET device.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
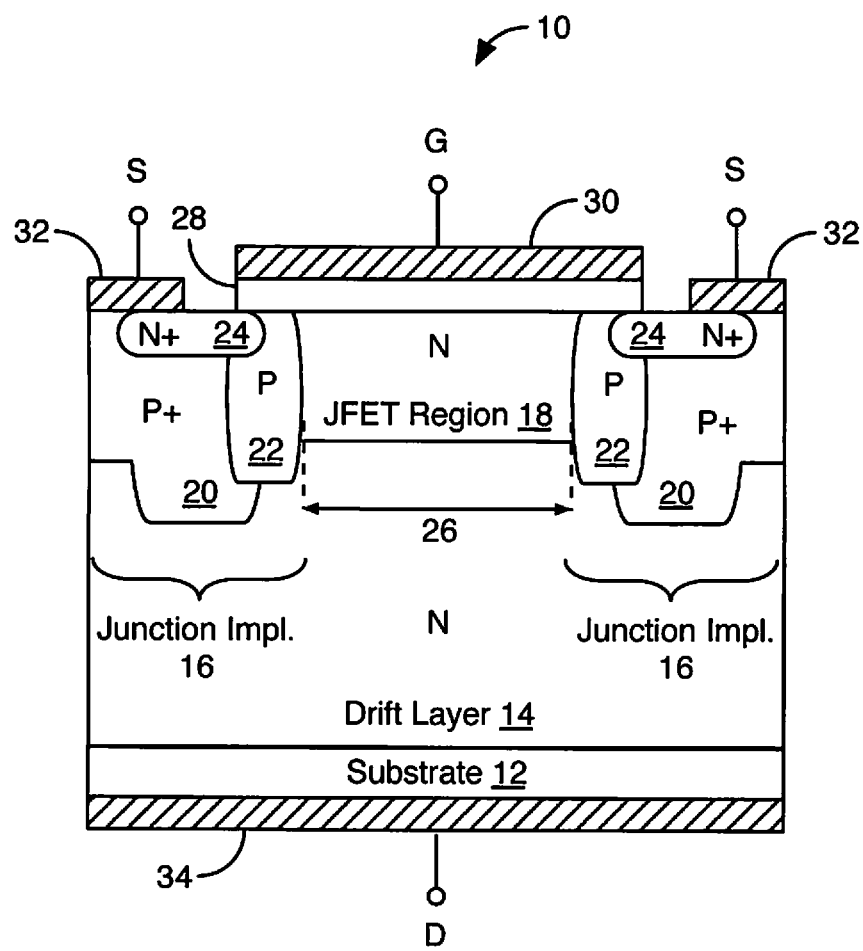
FIG. 1 shows a schematic representation of a conventional power metal-oxide-semiconductor field-effect transistor (MOSFET) device.
Figure 2A:
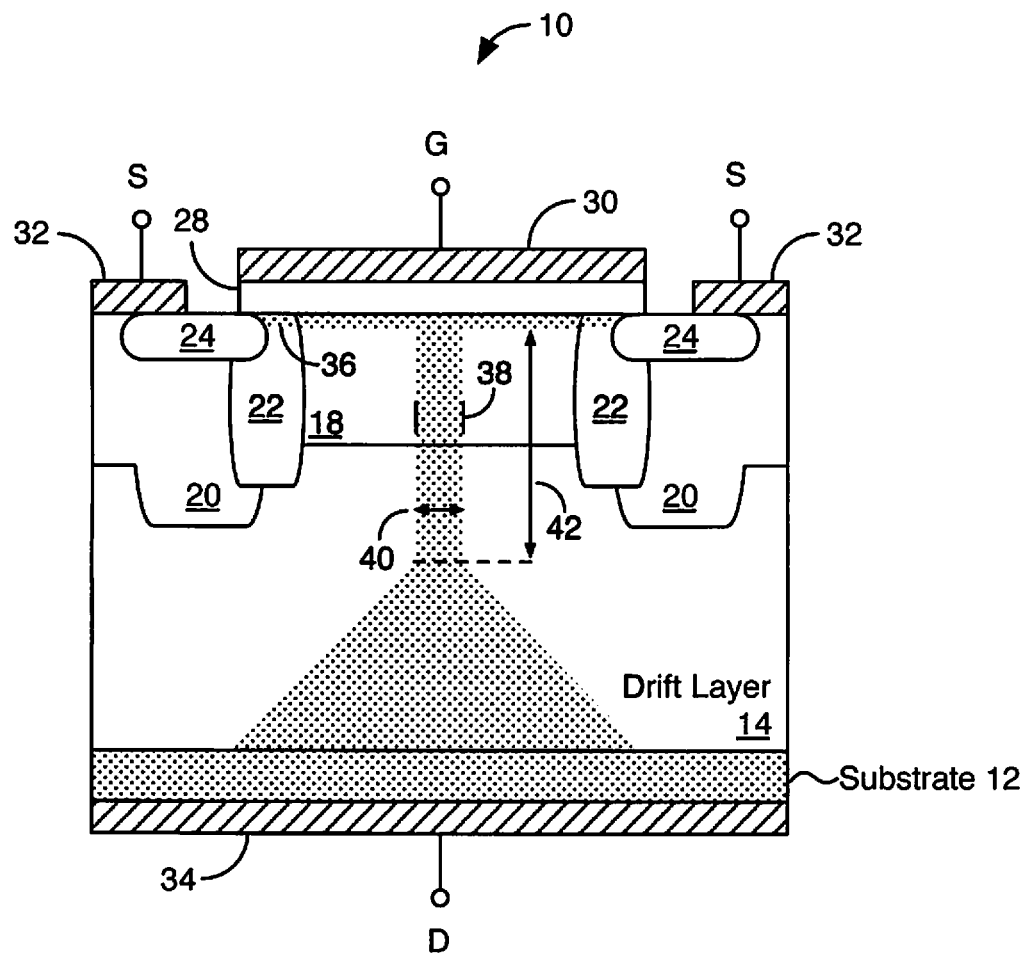
FIG. 2A shows details of the operation of the conventional power MOSFET device shown in FIG. 1 when the device is in an ON state of operation.
Figure 2B:
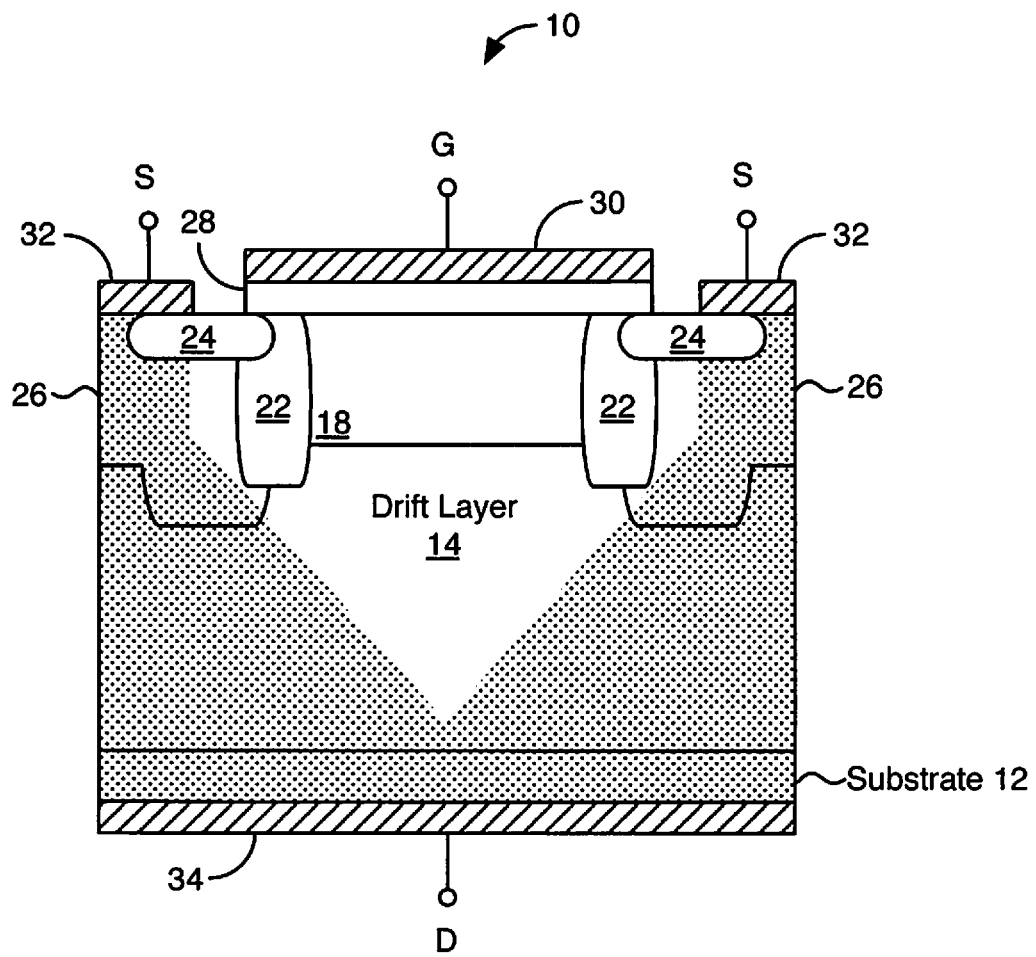
FIG. 2B shows details of the operation of the conventional power MOSFET device shown in FIG. 1 when the device is operated in the third quadrant.
Figure 3:
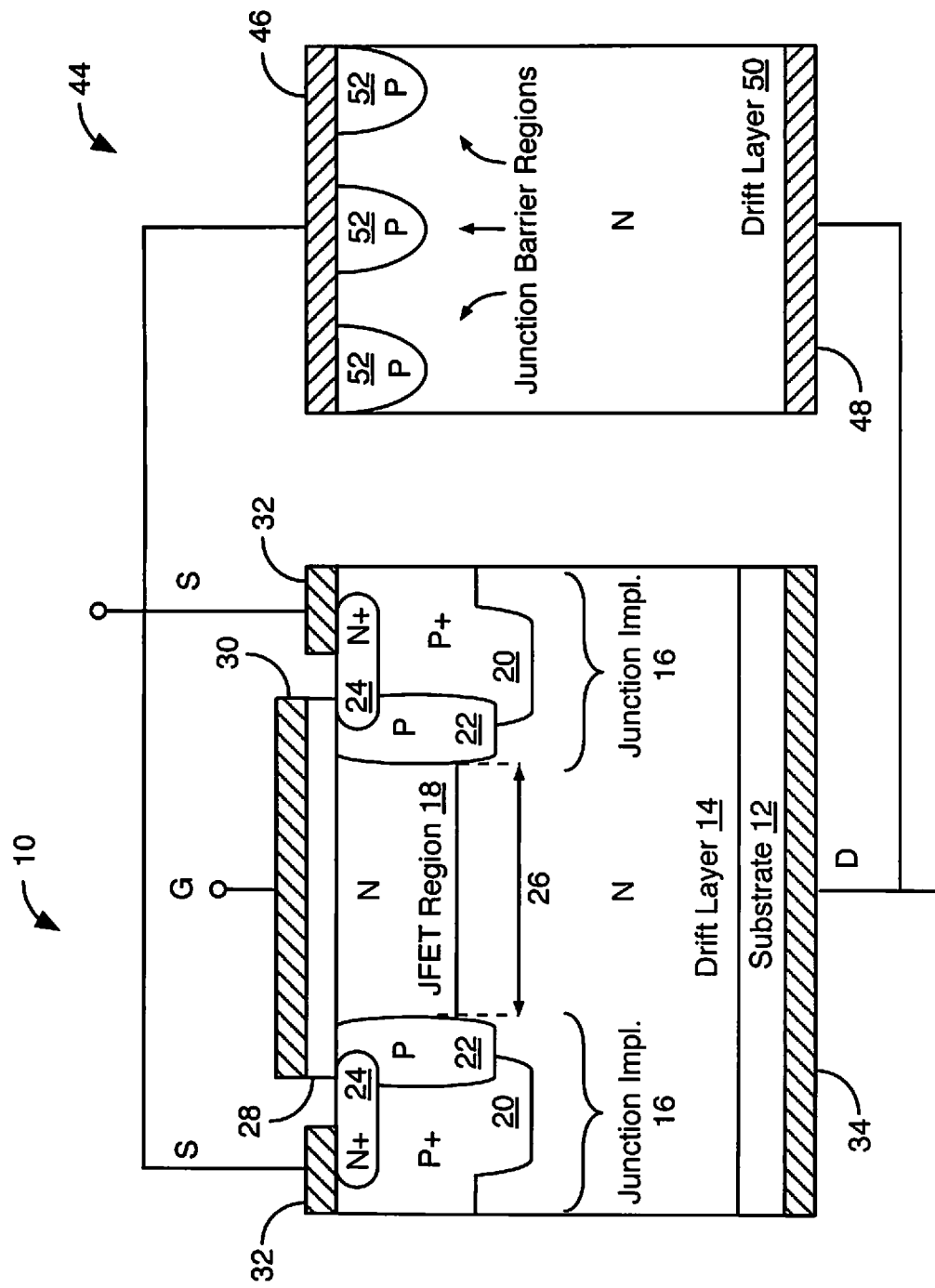
FIG. 3 shows a schematic representation of the conventional power MOSFET device shown in FIG. 1 attached to an external bypass diode.
Figure 4A:
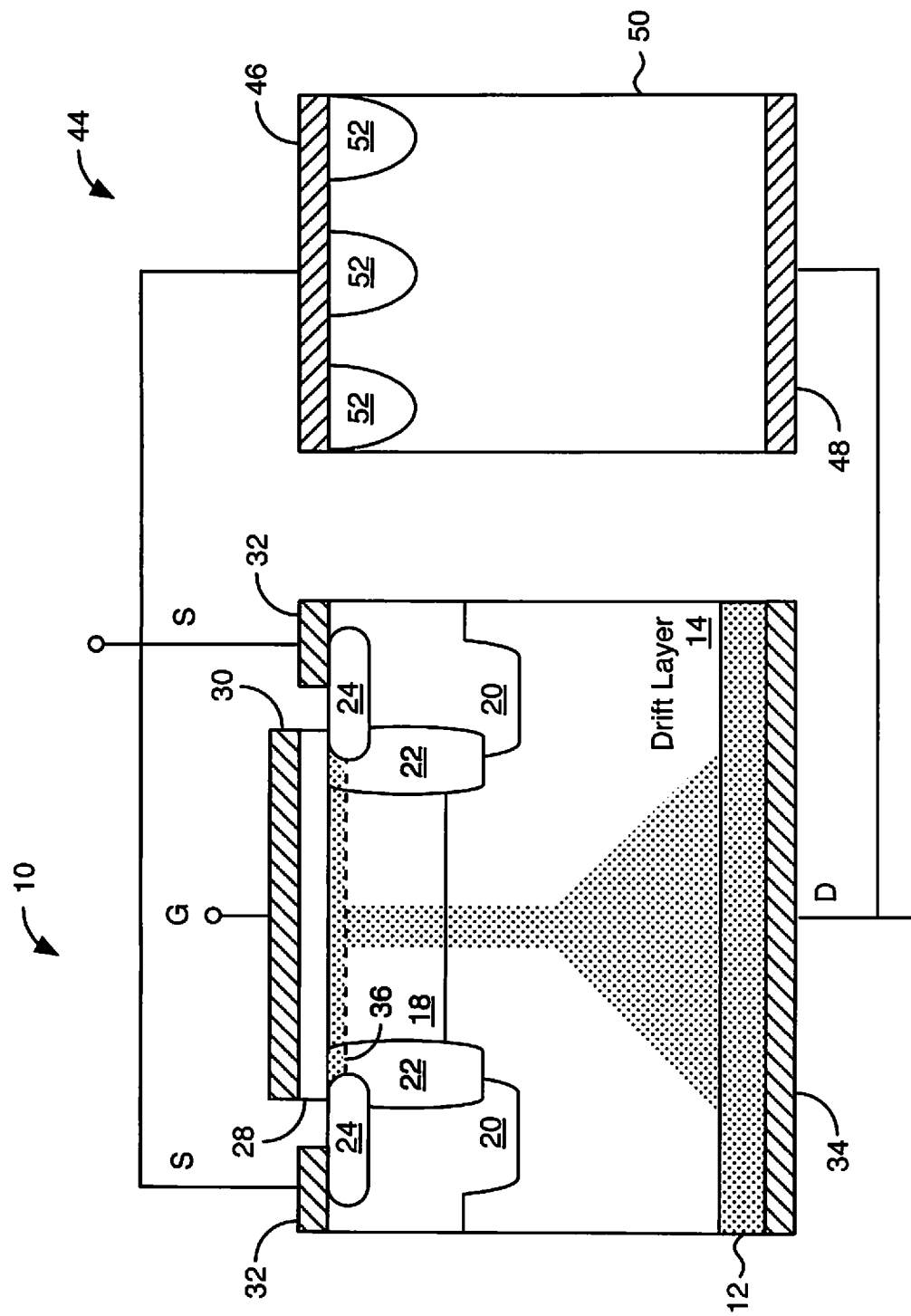
FIG. 4A shows details of the operation of the conventional power MOSFET device and attached external bypass diode when the device is in an ON state of operation.
Figure 4B:
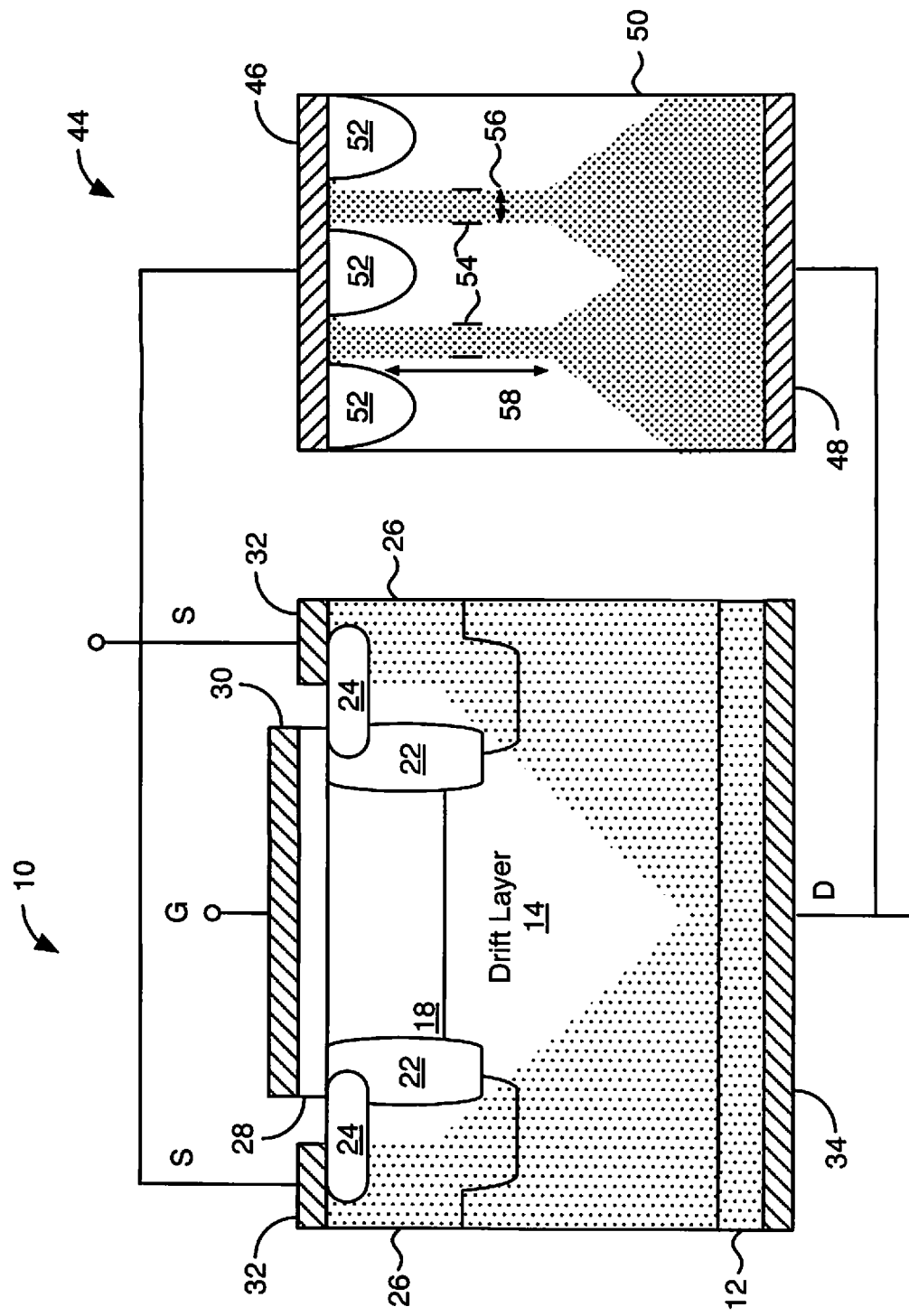
FIG. 4B shows details of the operation of the conventional power MOSFET device and attached external bypass diode when the conventional power MOSFET is operated in the third quadrant.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 5:
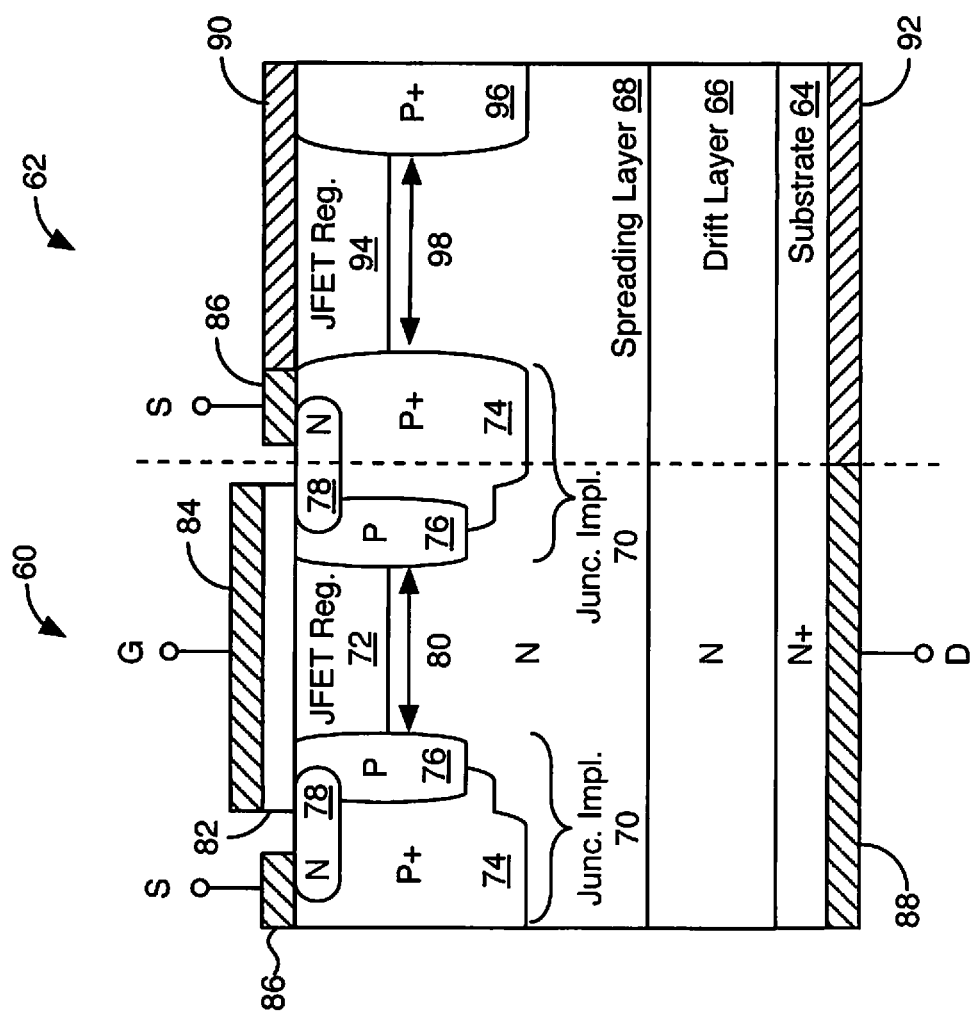
FIG. 5 shows a vertical field-effect transistor (FET) device and integrated bypass diode according to one embodiment of the present disclosure.

Turning now to FIG. 5, a vertical field-effect transistor (FET) device 60 is shown including a monolithically integrated bypass diode 62. The vertical FET device 60 includes a substrate 64, a drift layer 66 formed over the substrate 64, a spreading layer 68 formed over the drift layer 66, one or more junction implants 70 in the surface of the spreading layer 68 opposite the drift layer 66, and a junction gate field-effect transistor (JFET) region 72 between each one of the junction implants 70. Each one of the junction implants 70 may be formed by an ion implantation process, and includes a deep well region 74, a base region 76, and a source region 78. Each deep well region 74 extends from a corner of the spreading layer 68 opposite the drift layer 66 downwards towards the drift layer 66 and inwards towards the center of the spreading layer 68. The deep well region 74 may be formed uniformly or include one or more protruding regions. Each base region 76 is formed vertically from the surface of the spreading layer 68 opposite the drift layer 66 down towards the drift layer 66 along a portion of the inner edge of each one of the deep well regions 74. Each source region 78 is formed in a shallow portion on the surface of the spreading layer 68 opposite the drift layer 66, and extends laterally to overlap a portion of the deep well region 74 and the base region 76, without extending over either. The JFET region 72 defines a channel width 80 between each one of the junction implants 70.

A gate oxide layer 82 is positioned on the surface of the spreading layer 68 opposite the drift layer 66, and extends laterally between a portion of the surface of each source region 78, such that the gate oxide layer 82 partially overlaps and runs between the surface of each source region 78 in the junction implants 70. A gate contact 84 is positioned on top of the gate oxide layer 82. Two source contacts 86 are each positioned on the surface of the spreading layer 68 opposite the drift layer 66 such that each one of the source contacts 86 partially overlaps both the source region 78 and the deep well region 74 of each one of the junction implants 70, respectively, and does not contact the gate oxide layer 82 or the gate contact 84. A drain contact 88 is located on the surface of the substrate 64 opposite the drift layer 66.

The integrated bypass diode 62 is formed adjacent to the vertical FET device 60 on the same semiconductor die. The integrated bypass diode 62 includes the substrate 64, the drift layer 66, the spreading layer 68, one of the deep well regions 74, an anode 90, a cathode 92, a JFET region 94, and a deep junction barrier region 96. The anode 90 is joined with one of the source contacts 86 of the vertical FET device 60 on a surface of the spreading layer 68 opposite the drift layer 66. The cathode 92 is joined with the drain contact 88 of the vertical FET device 60 on a surface of the substrate 64 opposite the drift layer 66. The deep junction barrier region 96 is separated from the deep well region 74 of the vertical FET device 60 by the JFET region 94. The JFET region 94 defines a channel width 98 between the shared deep well region 74 and the deep junction barrier region 96.

The shared deep well region 74 effectively functions as both a deep well region in the vertical FET device 60 and a junction barrier region in the integrated bypass diode 62. By sharing one of the deep well regions 74 between the vertical FET device 60 and the integrated bypass diode 62, the built-in anti-parallel body diode formed by the junction between the shared deep well region 74 and the spreading layer 68 is effectively re-used to form one of the junction barrier regions of the integrated bypass diode 62.

As will be appreciated by those of ordinary skill in the art, in certain applications the integrated bypass diode 62 may be connected in opposite polarity, wherein the anode 90 is coupled to the drain contact 88 of the vertical FET device 60 and the cathode 92 is coupled to the source of the vertical FET device 60. This may occur, for example, when the vertical FET device 60 is a P-MOSFET device.

In operation, when a biasing voltage below the threshold voltage of the vertical FET device 60 is applied to the gate contact 84 and the junction between each deep well region 74 and the drift layer 66, as well as the deep junction barrier region 96 and the drift layer 66, is reverse biased, the vertical FET device 60 is placed in an OFF state of operation, and the integrated bypass diode 62 is placed in a reverse bias state of operation. Each reverse-biased junction generates an electric field that effectively expands to occupy the space between each one of the junction implants 70 and the deep junction barrier region 96. Accordingly, little to no leakage current is passed through the vertical FET device 60 or the integrated bypass diode 62. In the OFF state of operation of the vertical FET device 60, any voltage between the source contacts 86 and the drain contact 88 is supported by the drift layer 66 and the spreading layer 68. Due to the vertical structure of the vertical FET device 60, large voltages may be placed between the source contacts 86 and the drain contact 88 without damaging the device.

Figure 6A:
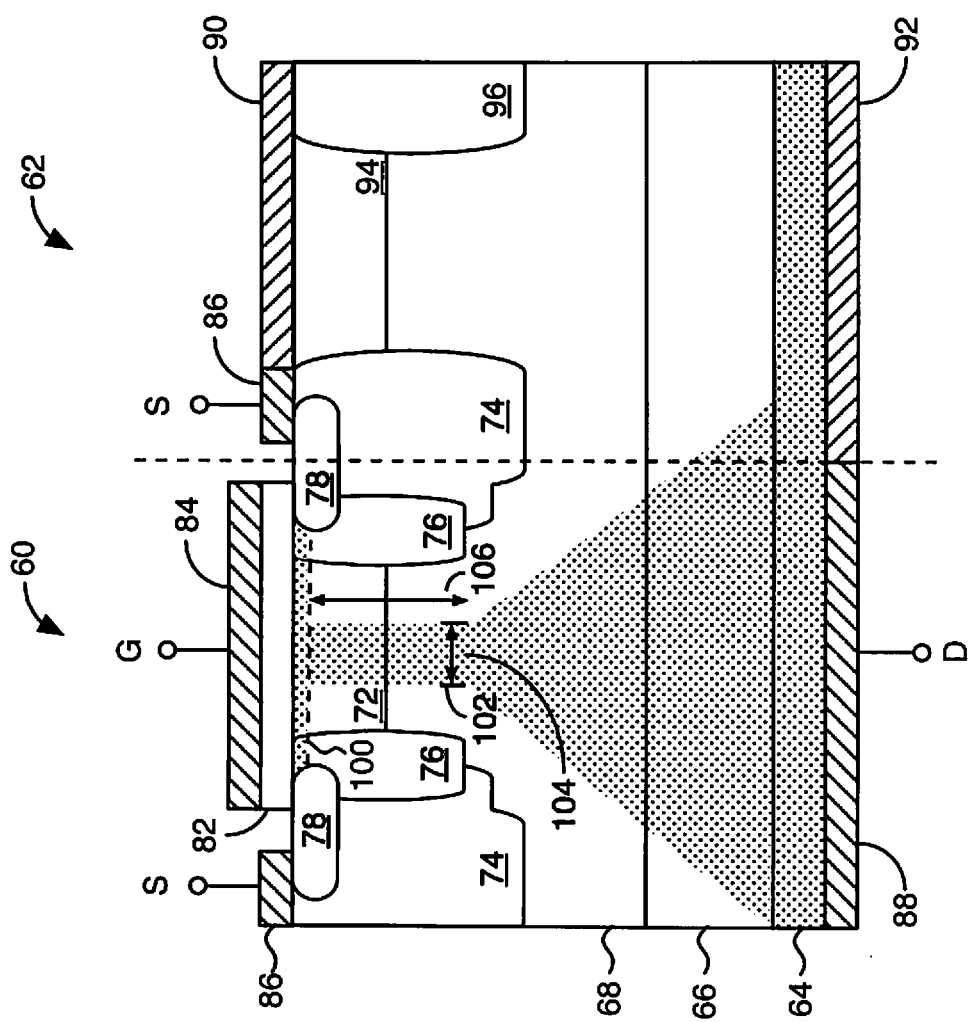
FIG. 6A shows details of the operation of the vertical FET device and integrated bypass diode according to one embodiment of the present disclosure.

FIG. 6A shows operation of the vertical FET device 60 and integrated bypass diode 62 when the vertical FET device 60 is in an ON state (first quadrant) of operation and the integrated bypass diode 62 is in a reverse bias mode of operation. When a positive voltage is applied to the drain contact 88 of the vertical FET device 60 relative to the source contact 86 and the gate voltage increases above the threshold voltage of the device, an inversion layer channel 100 is formed at the surface of the spreading layer 68 underneath the gate contact 84, thereby placing the vertical FET device 60 in an ON state of operation and placing the integrated bypass diode 62 in a reverse bias mode of operation. In the ON state of operation of the vertical FET device 60, current (shown by the shaded region in FIG. 6) is allowed to flow from the drain contact 88 to the source contacts 86 of the device. An electric field presented by the junctions formed between the deep well region 74, the base region 76, and the spreading layer 68 constricts current flow in the JFET region 72 into a JFET channel 102 having a JFET channel width 104. At a certain spreading distance 106 from the inversion layer channel 100 when the electric field presented by the junction implants 70 is diminished, the flow of current is distributed laterally, or spread out, in the spreading layer 68, as shown in FIG. 6. Because the integrated bypass diode 62 is reverse biased, current does not flow through the device.

Figure 6B:
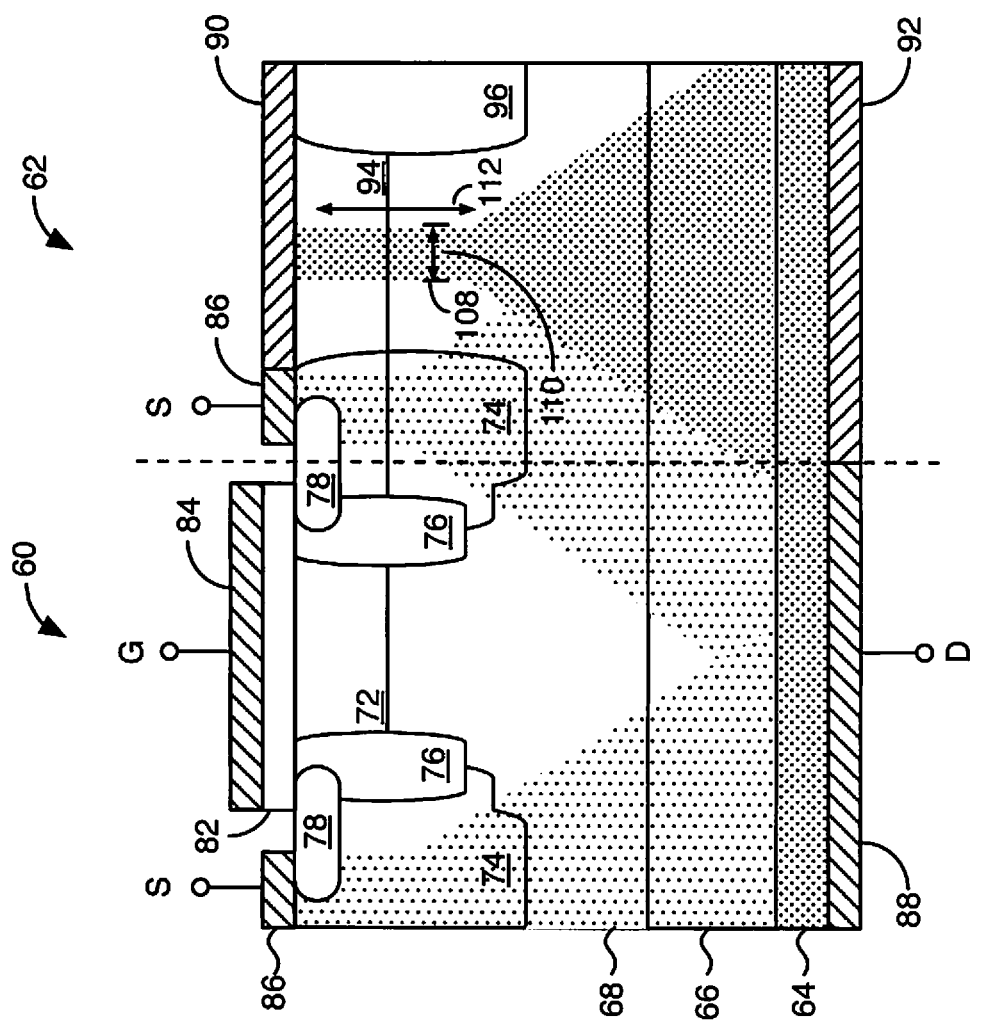
FIG. 6B shows details of the operation of the vertical FET device and integrated bypass diode according to one embodiment of the present disclosure.

FIG. 6B shows operation of the vertical FET device 60 and integrated bypass diode 62 when the vertical FET device 60 is operated in the third quadrant. When a bias voltage below the threshold voltage of the device is applied to the gate contact 84 of the vertical FET device 60 and a positive voltage is applied to the source contacts 86 relative to the drain contact 88, the vertical FET device 60 begins to operate in the third quadrant, and the integrated bypass diode 62 is placed in a forward bias mode of operation. In the third quadrant of operation, current flows from the source contacts 86 of the vertical FET device 60 through the deep well regions 74 and into the spreading layer 68, where it then travels through the drift layer 66 and the substrate 64 to the drain contact 88. Further, current flows from the anode 90 of the integrated bypass diode 62 into the spreading layer 68, where it then travels through the drift layer 66 and the substrate 64 to the drain contact 88.

Due to the low impedance path provided by the integrated bypass diode 62, the majority of the current flow through the vertical FET device 60 flows through the anode 90 of the integrated bypass diode 62 into the JFET region 94 of the device. In the JFET region 94, electromagnetic forces presented by the deep well region 74 and the deep junction barrier region 96 constrict current flow into a JFET channel 108 having a JFET channel width 110. At a certain spreading distance 112 from the anode 90 of the integrated bypass diode 62 when the electric field presented by the deep well region 74 and the deep junction barrier region 96 is diminished, the flow of current is distributed laterally, or spread out in the drift layer 66.

The spreading layer 68 of the integrated bypass diode 62 and vertical FET device 60 is doped in such a way to decrease resistance in the current path of each device. Accordingly, the JFET channel width 104 of the vertical FET device 60, the JFET channel width 110 of the integrated bypass diode 62, the spreading distance 106 of the vertical FET device 60, and the spreading distance 112 of the integrated bypass diode 62 may be decreased without negatively affecting the performance of either device. In fact, the use of the spreading layer 68 significantly decreases the ON resistance of both the vertical FET device 60 and the integrated bypass diode 62. A decreased ON resistance leads to a higher efficiency of the vertical FET device 60 and integrated bypass diode 62.

By monolithically integrating the vertical FET device 60 and the integrated bypass diode 62, each one of the devices is able to share the spreading layer 68, the drift layer 66, and the substrate 64. By sharing the spreading layer 68, the drift layer 66, and the substrate 64, the overall area available for current flow in the device is increased, thereby further decreasing the ON resistance of the integrated bypass diode 62 and the vertical FET device 60. Additionally, sharing the spreading layer 68, the drift layer 66, and the substrate 64 provides a greater area for heat dissipation for the integrated bypass diode 62 and the vertical FET device 60, which in turn allows the device to handle more current without risk of damage. Finally, by sharing one of the deep well regions 74 of the vertical FET device 60 with the integrated bypass diode 62, both of the devices can share a common edge termination. Since edge termination can consume a large fraction of the area in semiconductor devices, combining the integrated bypass diode 62 and the vertical FET device 60 with the shared deep well region 74 allows the area of at least one edge termination to be saved.

The advantages of combining the integrated bypass diode 62 and the vertical FET device 60 using a shared deep well region 74 allow for a better trade-off between the ON state forward drop of the integrated bypass diode 62 and the peak electric field in the Schottky interface between the anode 90 and the spreading layer 68. The reduction of the peak electric field in the Schottky interface between the anode 90 and the spreading layer 68 may allow the integrated bypass diode 62 to use a low barrier height Schottky metal for the anode 90, such as Tantalum.

The vertical FET device 60 may be, for example, a metal-oxide-silicon field-effect transistor (MOSFET) device made of silicon carbide (SiC). Those of ordinary skill in the art will appreciate that the concepts of the present disclosure may be applied to any materials system. The substrate 64 of the vertical FET device 60 may be about 180-350 microns thick. The drift layer 66 may be about 3.5-12.0 microns thick, depending upon the voltage rating of the vertical FET device 60. The spreading layer 68 may be about 1.0-2.5 microns thick. Each one of the junction barrier implants 52 may be about 1.0-2.0 microns thick. The JFET region 72 may be about 0.75-1.0 microns thick. The deep junction barrier region 96 may be about 1.0-2.0 microns thick.

According to one embodiment, the spreading layer 68 is an N-doped layer with a doping concentration about $1\times10^{16}$ $cm^{-3}$ to $2\times10^{17}$ $cm^{-3}$. The spreading layer 68 may be graded, such that the portion of the spreading layer 68 closest to the drift layer 66 has a doping concentration about $1\times10^{16}$ $cm^{-3}$ that is graduated as the spreading layer 68 extends upward to a doping concentration of about $2\times10^{17}$ $cm^{-3}$. According to an additional embodiment, the spreading layer 68 may comprise multiple layers. The layer of the spreading layer 68 closest to the drift layer may have a doping concentration of about $1\times10^{16}$ $cm^{-3}$. The doping concentration of each additional layer in the spreading layer 68 may decrease in proportion to the distance of the layer from the JFET region 72 of the vertical FET device 60. The portion of the spreading layer 68 farthest from the drift layer 66 may have a doping concentration about $2\times10^{17}$ $cm^{-3}$.

The JFET region 72 may be an N-doped layer with a doping concentration from about $1\times10^{16}$ $cm^{-3}$ to $1\times10^{17}$ $cm^{-3}$. The drift layer 66 may be an N-doped layer with a doping concentration about $6\times10^{15}$ $cm^{-3}$ to $1.5\times10^{16}$ $cm^{-3}$. The deep well region 74 may be a heavily P-doped region with a doping concentration about $5\times10^{17}$ $cm^{-3}$ to $1\times10^{20}$ $cm^{-3}$. The base region 76 may be a P-doped region with a doping concentration from about $5\times10^{16}$ $cm^{-3}$ to $1\times10^{19}$ $cm^{-3}$. The source region 78 may be an N-doped region with a doping concentration from about $1\times10^{19}$ $cm^{-3}$ to $1\times10^{21}$ $cm^{-3}$. The deep junction barrier region 96 may be a heavily P-doped region with a doping concentration about $5\times10^{17}$ $cm^{-3}$ to $1\times10^{20}$ $cm^{-3}$. The N doping agent may be nitrogen, phosphorous, or any other suitable element or combination thereof, as will be appreciated by those of ordinary skill in the art. The P-doping agent may be aluminum, boron, or any other suitable element or combination thereof, as will be appreciated by those of ordinary skill in the art.

The gate contact 84, the source contacts 86, and the drain contact 88 may be comprised of multiple layers. For example, each one of the contacts may include a first layer of nickel or nickel-aluminum, a second layer of titanium over the first layer, a third layer of titanium-nickel over the second layer, and a fourth layer of aluminum over the third layer. The anode 90 and the cathode 92 of the integrated bypass diode 62 may comprise titanium. Those or ordinary skill in the art will appreciate that the gate contact 84, the source contacts 86, and the drain contact 88 of the vertical FET device 60 as well as the anode 90 and the cathode 92 of the integrated bypass diode 62 may be comprised of any suitable material without departing from the principles of the present disclosure.

Figure 7:
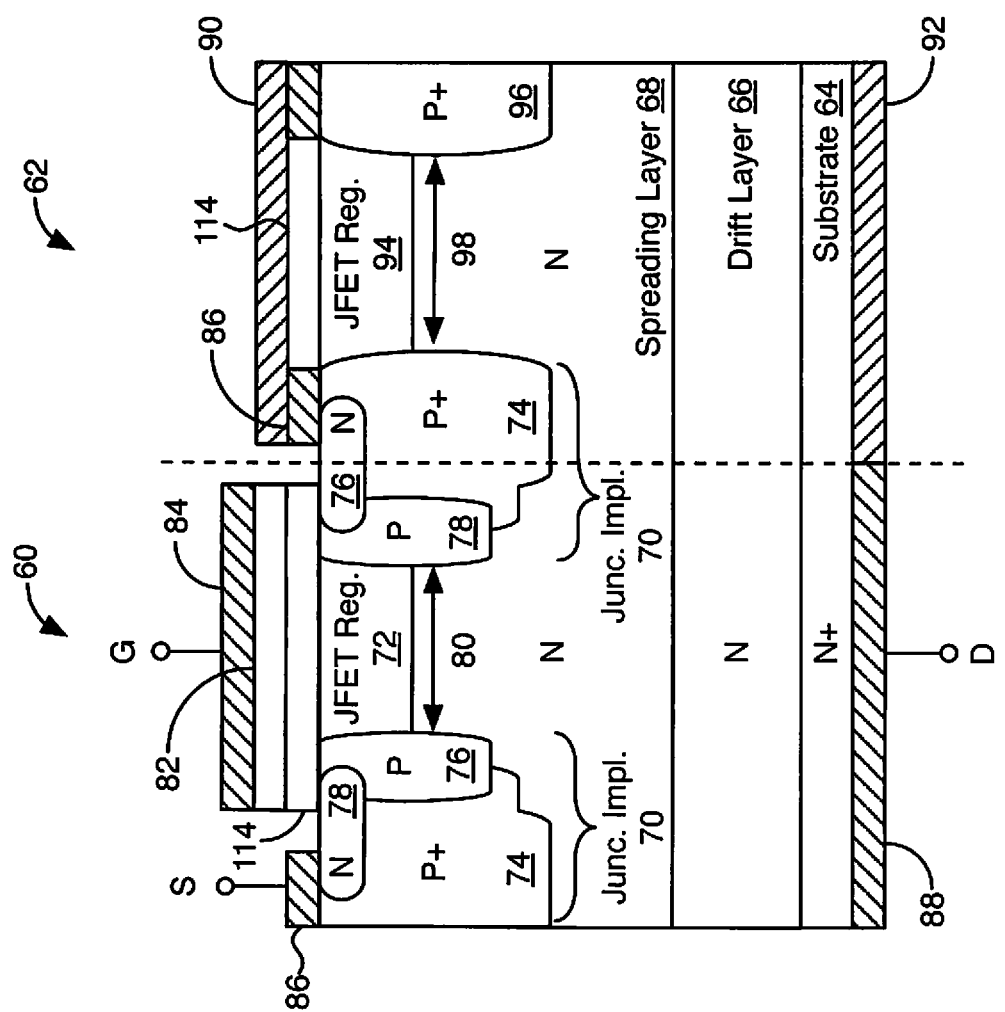
FIG. 7 shows a schematic representation of a vertical FET device and integrated bypass diode according to an additional embodiment of the present disclosure.

FIG. 7 shows the vertical FET device 60 including the integrated bypass diode 62 according to an additional embodiment of the present disclosure. The vertical FET device 60 shown in FIG. 7 is substantially similar to that shown in FIG. 5, but further includes a channel re-growth layer 114 between the gate oxide layer 82 of the vertical FET device 60 and the spreading layer 68, and also between the anode 90 of the integrated bypass diode 62 and the spreading layer 68. The channel re-growth layer 114 is provided to lower the threshold voltage of the vertical FET device 60 and the integrated bypass diode 62. Specifically, the deep well regions 74 of the vertical FET device 60 and the deep junction barrier region 96 of the integrated bypass diode 62, due to their high doping levels, may raise the threshold voltage of the vertical FET device 60 and the integrated bypass diode 62 to a level that inhibits optimal performance. Accordingly, the channel re-growth layer 114 may offset the effects of the deep well regions 74 and the deep junction barrier region 96 in order to lower the threshold voltage of the vertical FET device 60 and the integrated bypass diode 62. The channel re-growth layer 114 may be an N-doped region with a doping concentration from about $1 \times 10^{15}$ cm$^{-3}$ to $1 \times 10^{17}$ cm$^{-3}$.

Figure 8:
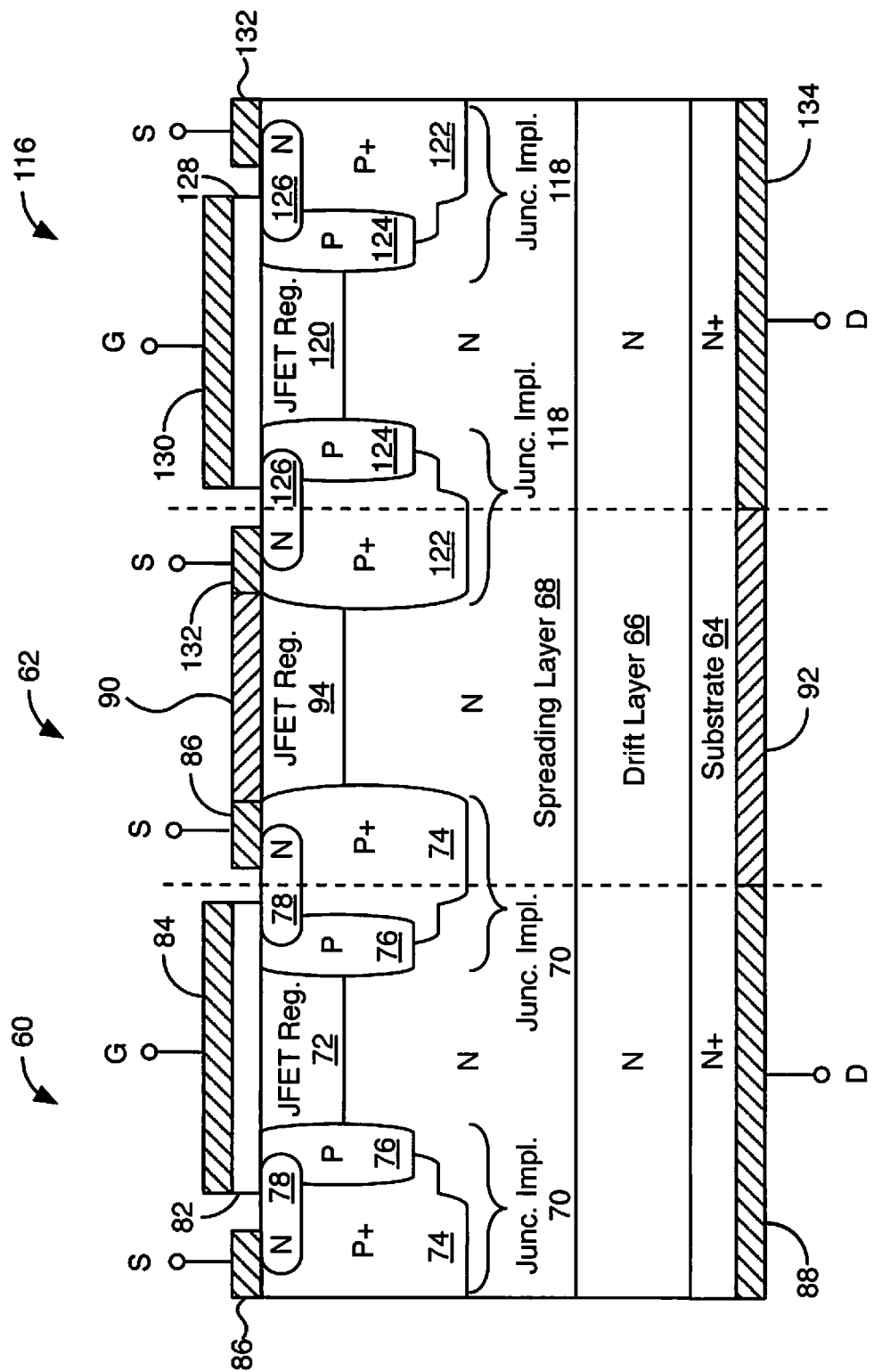
FIG. 8 shows a schematic representation of a dual vertical FET device and integrated bypass diode according to one embodiment of the present disclosure.

FIG. 8 shows the vertical FET device 60 including the integrated bypass diode 62 according to an additional embodiment of the present disclosure. The vertical FET device 60 shown in FIG. 8 is substantially similar to that shown in FIG. 5, but further includes an additional vertical FET device 116 on the side of the integrated bypass diode 62 opposite the vertical FET device 60. The additional vertical FET device 116 is substantially similar to the vertical FET device 60, and includes the substrate 64, the drift layer 66, the spreading layer 68, a pair of junction implants 118 in the surface of the spreading layer 68, and a JFET region 120 between each one of the junction implants 118. Each one of the junction implants 118 may be formed by an ion implantation process, and includes a deep well region 122, a base region 124, and a source region 126. Each deep well region 122 extends from a corner of the spreading layer 68 opposite the drift layer 66 downwards towards the drift layer 66 and inwards towards the center of the spreading layer 68. The deep well regions 122 may be formed uniformly or include one or more protruding regions. Each base region 124 is formed vertically from the surface of the spreading layer 68 opposite the drift layer 66 downwards towards the drift layer 66 along a portion of the inner edge of each one of the deep well regions 122. Each source region 126 is formed in a shallow portion on the surface of the spreading layer 68 opposite the drift layer 66, and extends laterally to overlap a portion of a respective deep well region 122 and source region 124, without extending over either.

A gate oxide layer 128 is positioned on the surface of the spreading layer 68 opposite the drift layer 66, and extends laterally between a portion of the surface of each source region 126, such that the gate oxide layer 128 partially overlaps and runs between the surface of each source region 126 in the junction implants 118. A gate contact 130 is positioned on top of the gate oxide layer 128. Two source contacts 132 are each positioned on the surface of the spreading layer 68 opposite the drift layer 66 such that each one of the source contacts 132 partially overlaps both the source region 126 and the deep well region 122 of each one of the junction implants 118, respectively, and does not contact the gate oxide layer 128 or the gate contact 130. A drain contact 134 is located on the surface of the substrate 64 opposite the drift layer 66.

As shown in FIG. 8, the integrated bypass diode 62 shares a deep well region with each one of the vertical FET devices. Accordingly, the benefits of the integrated bypass diode 62 are incorporated into each one of the vertical FET devices at a minimal cost. The integrated bypass diode 62 can share at least one edge termination region with both the vertical FET device 60 and the additional vertical FET device 116, thereby saving additional space. Further, current in the device has an even larger spreading layer 68 and drift layer 66 to occupy than that of a single vertical FET device and integrated bypass diode, which may further decrease the ON resistance and thermal efficiency of the device.

Figure 9:
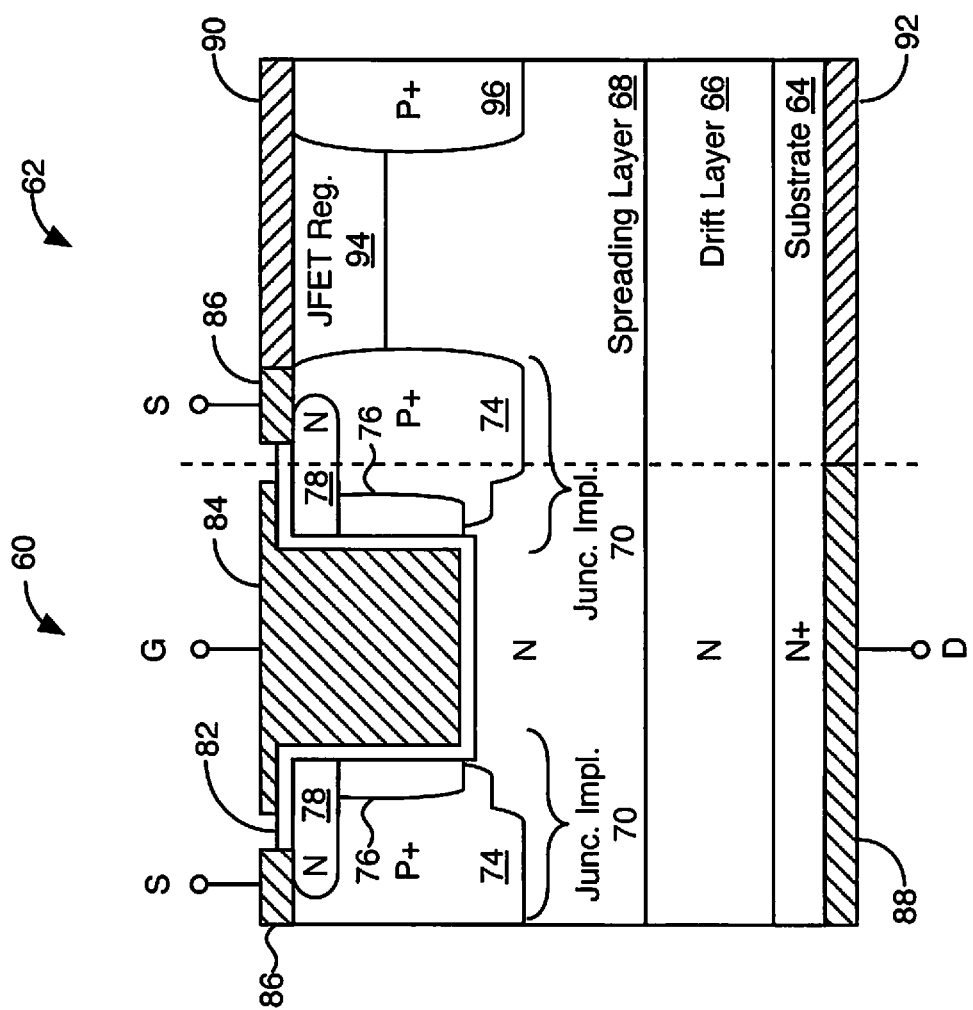
FIG. 9 shows a schematic representation of a trench vertical FET device and integrated bypass diode according to one embodiment of the present disclosure.

FIG. 9 shows the vertical FET device 60 including the integrated bypass diode 62 according to an additional embodiment of the present disclosure. The vertical FET device 60 shown in FIG. 9 is substantially similar to that shown in FIG. 5, except the vertical FET device 60 shown in FIG. 9 is arranged in a trench configuration. Specifically, the gate oxide layer 82 and the gate contact 84 of the vertical FET device 60 are inset in the spreading layer 68 of the vertical FET device 60 to form a trench transistor device. The gate contact 84 of the vertical FET device 60 may extend 0.75-1.5 microns into the surface of the spreading layer 68 opposite the drift layer 66. The gate oxide layer 82 may form a barrier between the surface of the spreading layer 68, the junction implants 70, and the gate contact 84. The trench-configured vertical FET device 60 shown in FIG. 9 will perform substantially similar to the vertical FET device 60 shown in FIG. 5, but may provide certain performance enhancements, for example, in the ON state resistance of the vertical FET device 60.

Figure 10:
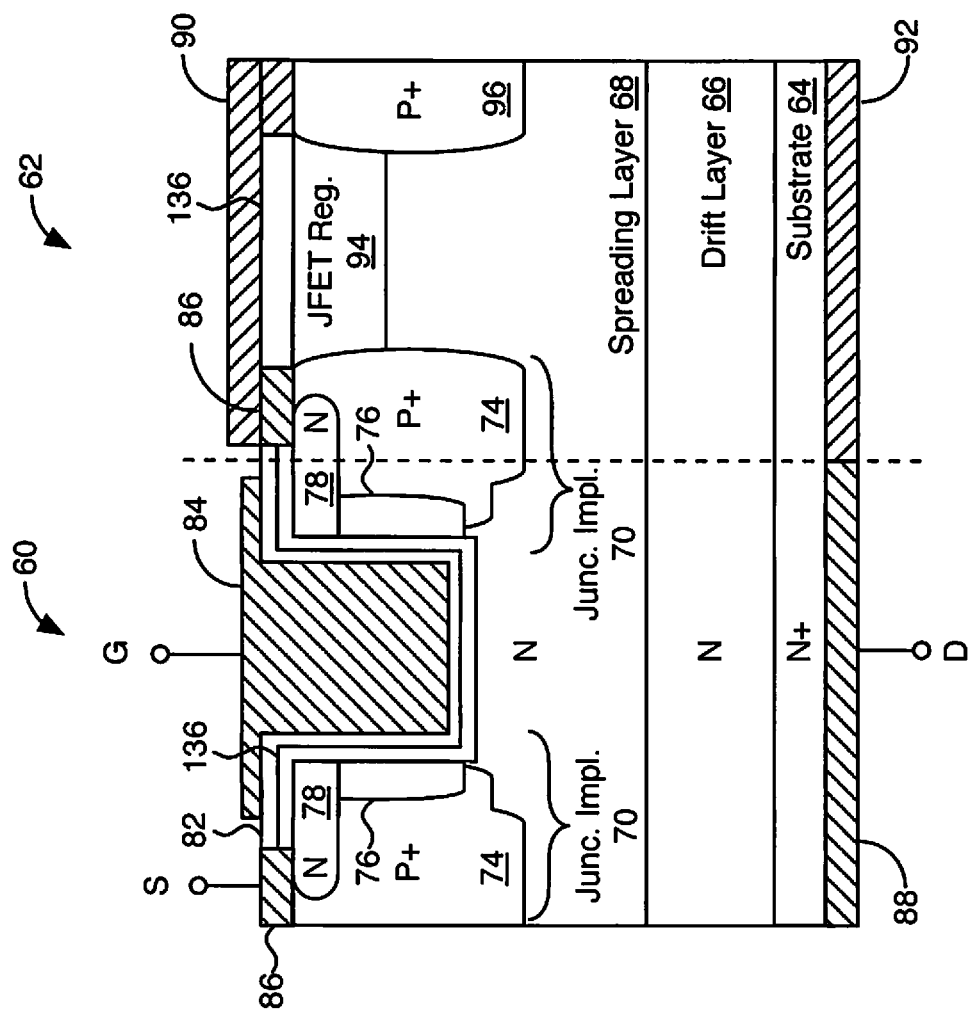
FIG. 10 shows a schematic representation of the trench vertical FET and integrated bypass diode shown in FIG. 9 according to an additional embodiment of the present disclosure.

FIG. 10 shows the vertical FET device 60 including the integrated bypass diode 62 according to an additional embodiment of the present disclosure. The vertical FET device 60 shown in FIG. 10 is substantially similar to that shown in FIG. 9, except the vertical FET device 60 further includes a channel re-growth layer 136 between the gate oxide layer 82, the spreading layer 68, and the junction implants 70 of the vertical FET device 60, and also between the anode 90 of the integrated bypass diode 62 and the spreading layer 68. As discussed above, the channel re-growth layer 136 is provided to lower the threshold voltage of the vertical FET device 60 and the integrated bypass diode 62. Specifically, the channel re-growth layer 136 may be provided to offset the effects of the heavily doped deep well regions 74 and deep junction barrier region 96. According to one embodiment, the channel re-growth layer 136 is an N-doped region with a doping concentration from about $1 \times 10^{15}$ cm$^{-3}$ to $1 \times 10^{17}$ cm$^{-3}$.

Figure 11:
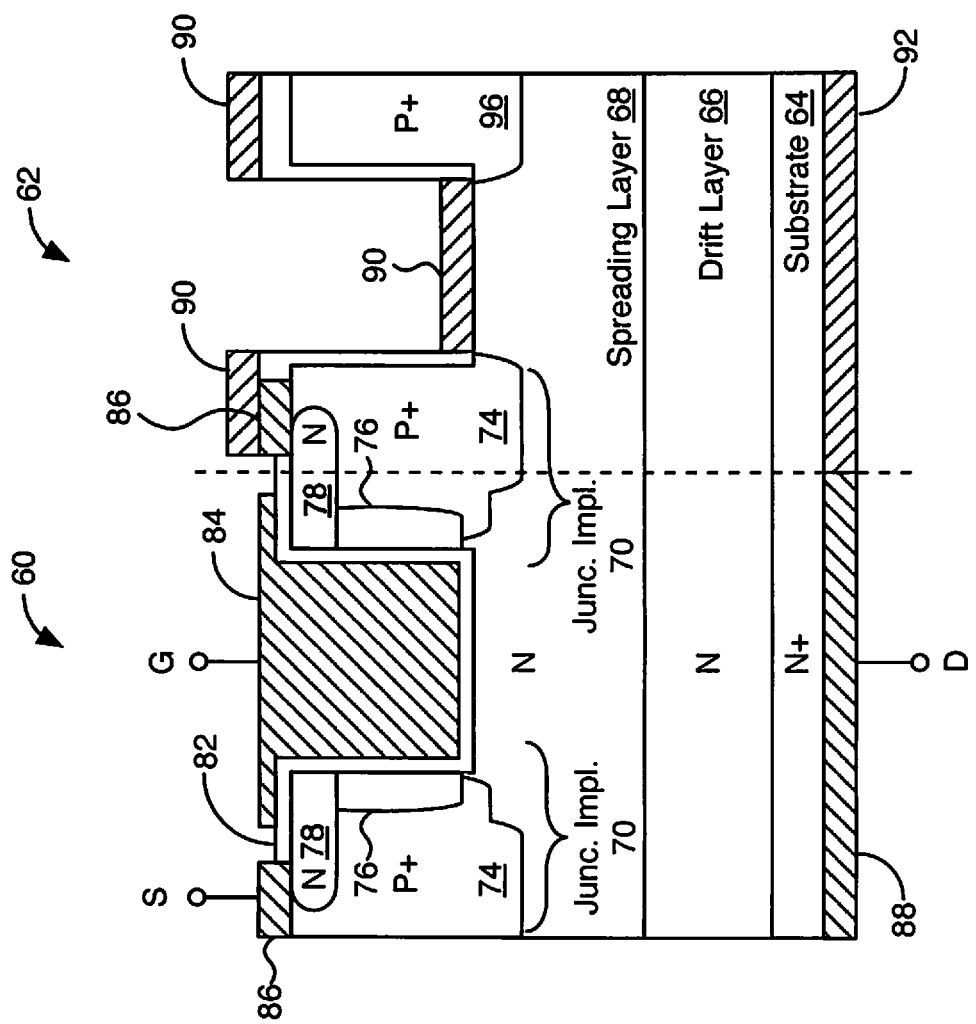
FIG. 11 shows a schematic representation of the trench vertical FET and integrated bypass diode shown in FIG. 9 according to an additional embodiment of the present disclosure.

FIG. 11 shows the vertical FET device 60 including the integrated bypass diode 62 according to an additional embodiment of the present disclosure. The vertical FET device 60 shown in FIG. 11 is substantially similar to that shown in FIG. 9, except that the integrated bypass diode 62 coupled to the vertical FET device 60 in FIG. 11 is also arranged in a trench configuration. Specifically, the anode 90 of the integrated bypass diode may be inset in the spreading layer 68 by about 0.75-1.5 microns. An oxide layer may be provided along the lateral portions of the trench in contact with the spreading layer 68 and the junction implants 70.

The vertical FET device 60 and integrated bypass diode 62 will perform substantially similar to the devices described above, but may provide certain performance improvements, for example, in the forward bias voltage drop across the integrated bypass diode 62.

Figure 12:
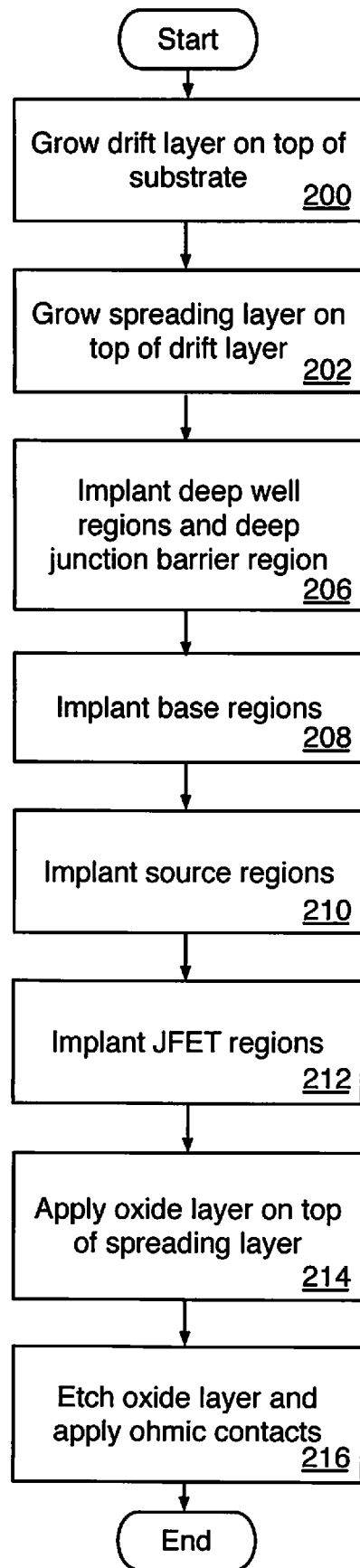
FIG. 12 shows a process for manufacturing the vertical FET device and integrated bypass diode shown in FIG. 5 according to one embodiment of the present disclosure.
Figure 13:
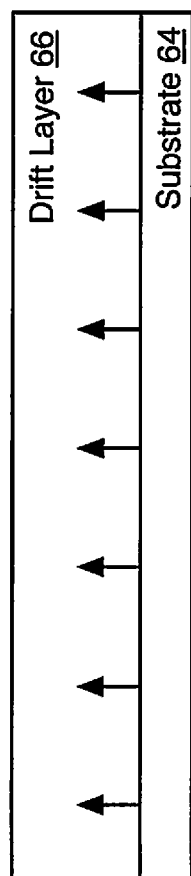
FIGS. 13-20 illustrate the process described in FIG. 12 for manufacturing the vertical FET device and integrated bypass diode.
Figure 14:
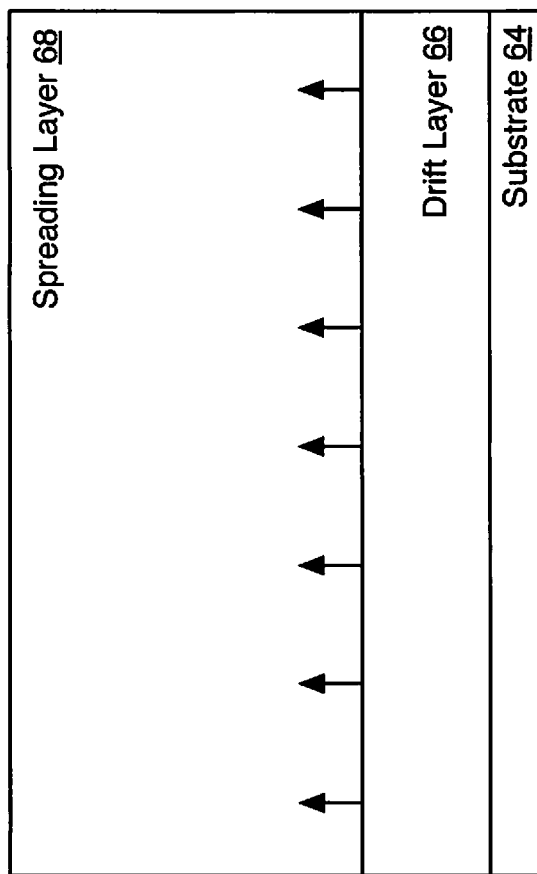
Figure 15:
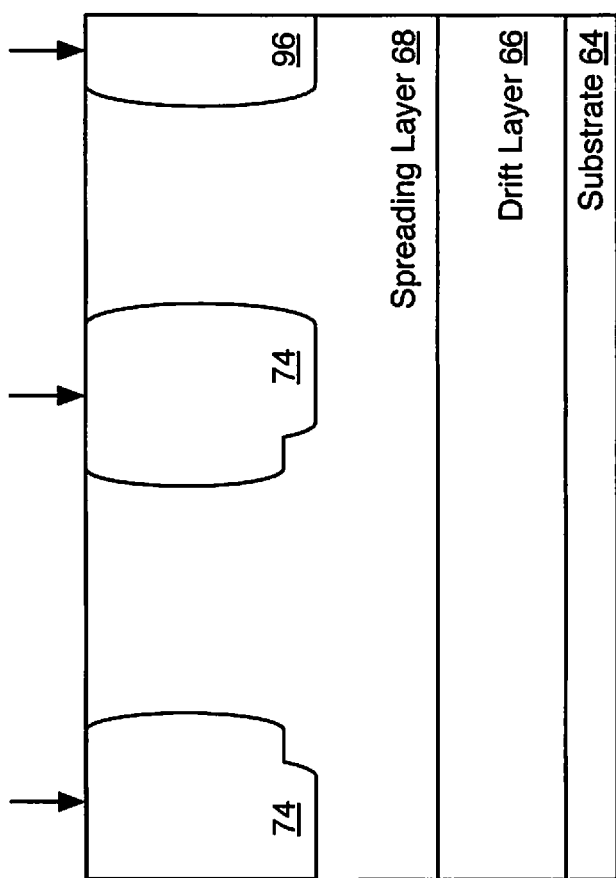
Figure 16:
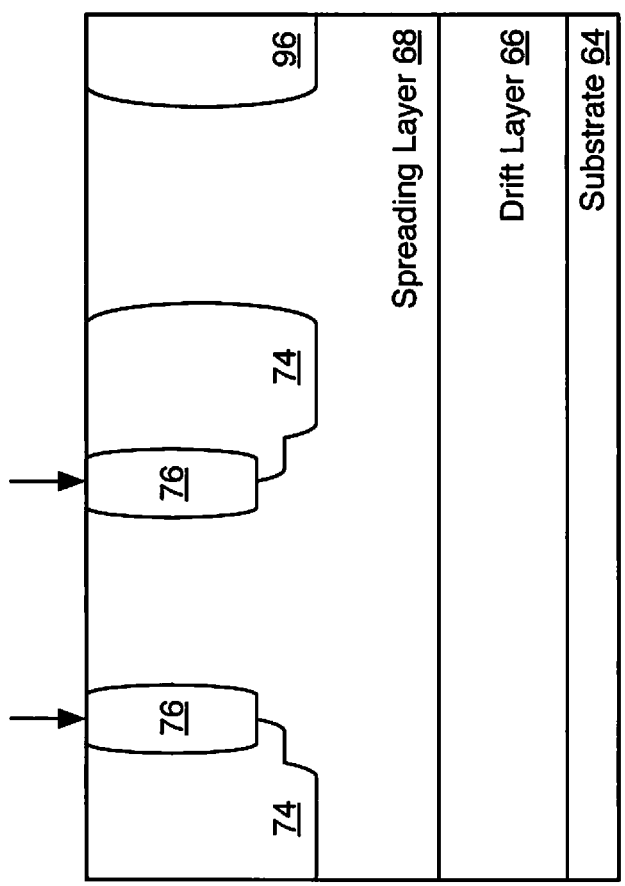
Figure 17:
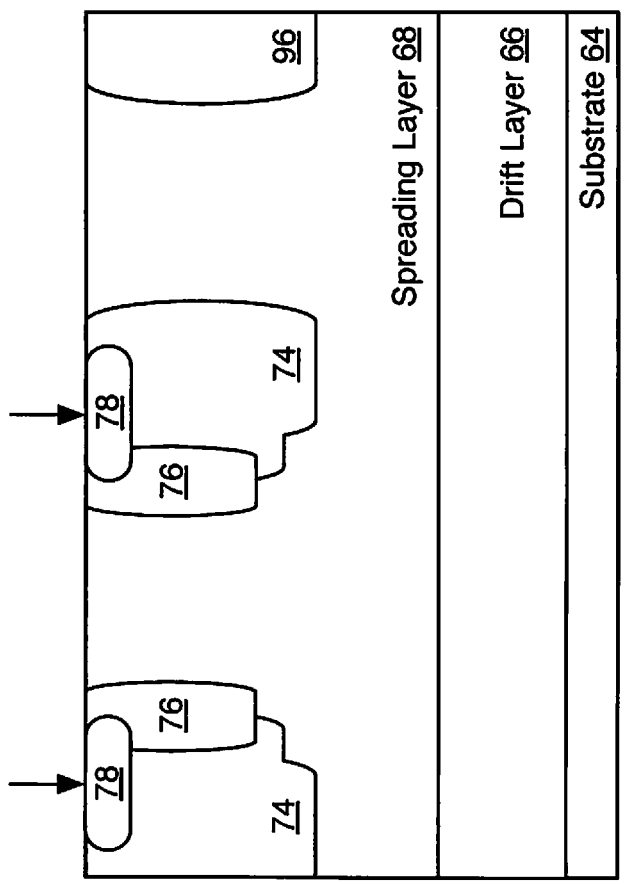

FIG. 12 and the following FIGS. 13-20 illustrate a process for manufacturing the vertical FET device 60 and the integrated bypass diode 62 shown in FIG. 5. First, the drift layer 66 is epitaxially grown on a surface of the substrate 64 (step 200 and FIG. 13). Next, the spreading layer 68 is epitaxially grown on the surface of the drift layer 66 opposite the substrate 64 (step 202 and FIG. 14). The deep well regions 74 and the deep junction barrier region 96 are then implanted (step 206 and FIG. 15). In order to achieve the depth required for the deep well regions 74 and the deep junction barrier region 96, a two-step ion implantation process may be used, wherein boron is used to obtain the necessary depth, while aluminum is used to obtain desirable conduction characteristics of the deep well regions 74 and the deep junction barrier region 96. The base regions 76 are then implanted (step 208 and FIG. 16). Next, the source regions 78 are implanted (step 210 and FIG. 17). The deep well regions 74, the base regions 76, the source regions 78, and the deep junction barrier region 96 may be implanted via an ion implantation process. Those of ordinary skill in the art will realize that the deep well regions 74, the base regions 76, the source regions 78, and the deep junction barrier region 96 may be created by any suitable process without departing from the principles of the present disclosure.

Figure 18:
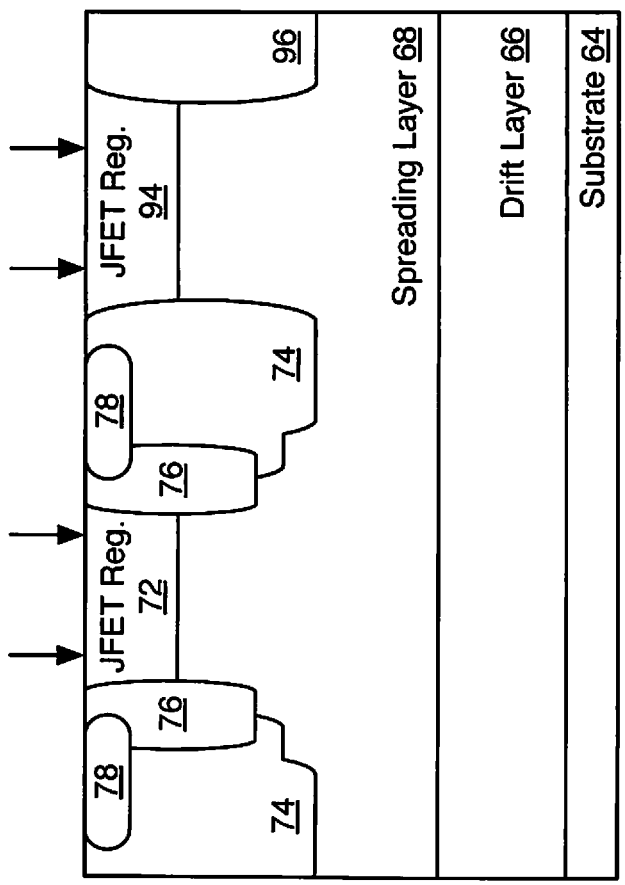
Figure 19:
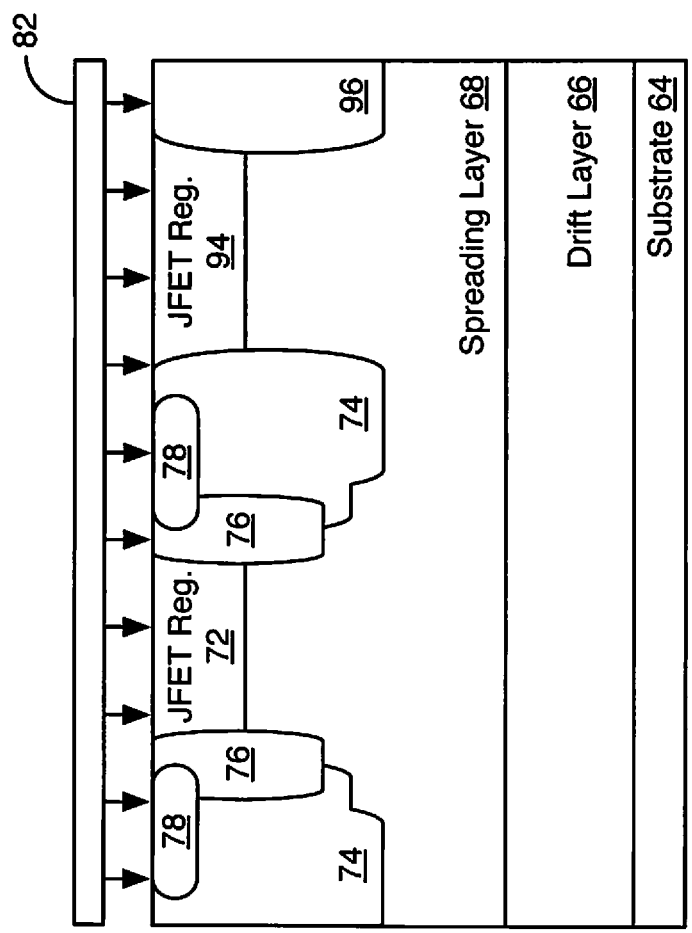
Figure 20:
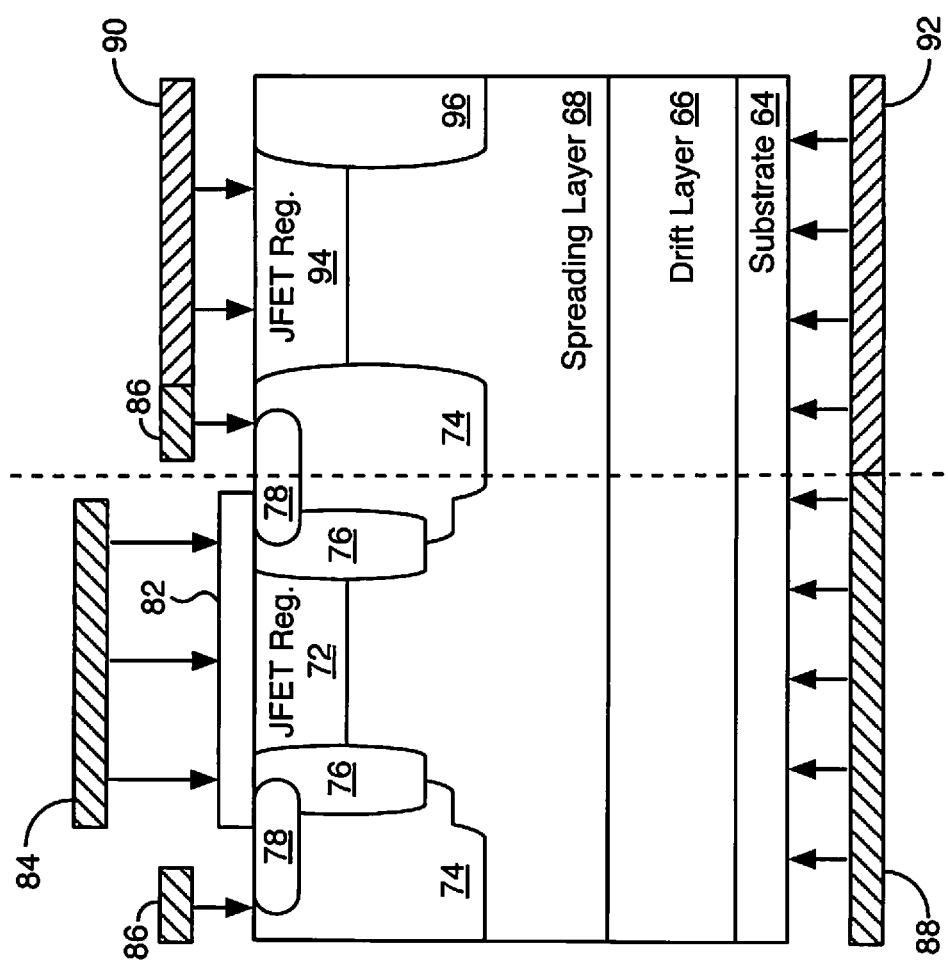

Next, the JFET region 72 of the vertical FET device 60 and the JFET region 94 of the integrated bypass diode 62 are implanted, for example, by an ion implantation process (step 212 and FIG. 18). The JFET region 72 of the vertical FET device 60 and the JFET region 94 of the integrated bypass diode 62 may also be epitaxially grown together as a single layer, and later etched into their individual portions. The gate oxide layer 82 is then applied to the surface of the spreading layer 68 opposite the drift layer 66 (step 214 and FIG. 19). The gate oxide layer 82 is then etched, and the ohmic contacts (gate contact 84, source contacts 86, drain contact 88, anode 90, and cathode 92) are attached to the vertical FET device 60 and the integrated bypass diode 62 (step 216 and FIG. 20). An over-mold layer may be provided over the surface of the spreading layer 68 opposite the drift layer 66 to protect the vertical FET device 60 and integrated bypass diode 62.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
a substrate;
a drift layer over the substrate;
a spreading layer over the drift layer, wherein the substrate, the drift layer, and the spreading layer have a first doping type, and a doping concentration of the spreading layer is greater than a doping concentration of the drift layer;
a metal-oxide semiconductor field-effect transistor (MOSFET) comprising:
a first implant region and a second implant region in the spreading layer opposite the drift layer, wherein the first implant region and the second implant region are separated by a portion of the spreading layer and have a second doping type that is opposite the first doping type;
a first trench in the spreading layer opposite the drift layer between the first implant region and the second implant region;
a first oxide layer on the spreading layer in the first trench;
a channel re-growth layer between the first oxide layer and the spreading layer in the first trench and between the first oxide layer and a top surface of the first implant region, wherein the channel re-growth layer has the first doping type;
a gate contact on the first oxide layer;
a source contact on the spreading layer over the first implant region and the second implant region; and
a drain contact on the substrate opposite the drift layer; and
a junction barrier Schottky (JBS) diode adjacent to the MOSFET and comprising:
a third implant region in the spreading layer opposite the drift layer, wherein the third implant region is separated from the second implant region by a portion of the spreading layer and has the second doping type;
an anode contact on a surface of the spreading layer between the second implant region and the third implant region, wherein the channel re-growth layer is between the anode contact and the spreading layer; and
a cathode contact on a surface of the substrate opposite the drift layer.

2. The semiconductor device of claim 1 wherein a doping concentration of the substrate is greater than the doping concentration of the drift layer.

3. The semiconductor device of claim 2 wherein:
the doping concentration of the drift layer is between about $6 \times 10^{15}$ cm$^{-3}$ and $1.5 \times 10^{16}$ cm$^{-3}$; and
the doping concentration of the spreading layer is between about $5 \times 10^{16}$ cm$^{-3}$ and $2 \times 10^{17}$ cm$^{-3}$.

4. The semiconductor device of claim 3 wherein each one of the first implant region, the second implant region, and the third implant region has a doping concentration between about $5 \times 10^{17}$ cm$^{-3}$ and $1 \times 10^{20}$ cm$^{-3}$.

5. The semiconductor device of claim 2 wherein the spreading layer comprises multiple layers.

6. The semiconductor device of claim 5 wherein each layer of the spreading layer has a different doping concentration.

7. The semiconductor device of claim 6 wherein:
a first layer of the spreading layer opposite the drift layer has a doping concentration of about $2 \times 10^{17}$ cm$^{-3}$;
a second layer of the spreading layer adjacent to the drift layer has a doping concentration of about $5 \times 10^{16}$ cm$^{-3}$; and
a doping concentration of each additional layer of the spreading layer between the first layer and the second layer decreases in proportion to a distance of the additional layer from the first layer, starting at the doping concentration of the first layer, and ending at the doping concentration of the second layer.

8. The semiconductor device of claim 1 wherein a portion of the spreading layer closest to the drift layer has a doping concentration of about $5 \times 10^{16}$ cm$^{-3}$ that is graduated as the spreading layer extends away from the drift layer to a doping concentration of about $2 \times 10^{17}$ cm$^{-3}$.

9. The semiconductor device of claim 1 wherein the semiconductor device is a silicon carbide (SiC) device.

10. The semiconductor device of claim 1 wherein the anode contact comprises a low barrier height Schottky metal.

11. The semiconductor device of claim 10 wherein the anode contact comprises Tantalum.

12. The semiconductor device of claim 1 wherein the first implant region and the second implant region have a depth that is greater than a depth of the first trench.

13. The semiconductor device of claim 12 wherein the first implant region and the second implant region are in contact with a sidewall of the first trench at least to a depth that is greater than a depth of the gate contact.

14. A method of manufacturing a semiconductor device comprising:
   growing a drift layer on a substrate;
   growing a spreading layer on the drift layer such that the substrate, the drift layer, and the spreading layer have a first doping type, and the spreading layer has a doping concentration that is higher than a doping concentration of the drift layer;
   providing a metal-oxide semiconductor field-effect transistor (MOSFET) comprising:
      implanting a first implant region and a second implant region in the spreading layer opposite the drift layer such that the first implant region and the second implant region are separated by a portion of the spreading layer and have a second doping type that is opposite the first doping type;
      etching a first trench in the spreading layer opposite the drift layer between the first implant region and the second implant region;
      depositing a first oxide layer on the spreading layer in the first trench;
      providing a channel re-growth layer between the first oxide layer and the spreading layer in the first trench and between the first oxide layer and a top surface of the first implant region, wherein the channel re-growth layer has the first doping type;
      providing a gate contact on the first oxide layer;
      providing a source contact on the spreading layer over the first implant region and the second implant region; and
      providing a drain contact on the substrate opposite the drift layer; and
   providing a junction barrier Schottky (JBS) diode adjacent to the MOSFET and comprising:
      providing a third implant region in the spreading layer opposite the drift layer such that the third implant region is laterally separated from the second implant region by a portion of the spreading layer and has the second doping type;
      providing an anode contact on a surface of the spreading layer between the second implant region and the third implant region such that the channel re-growth layer is between the anode contact and the spreading layer; and
      providing a cathode contact over a surface of the substrate opposite the drift layer.

15. The method of claim 14 wherein a doping concentration of the substrate is greater than the doping concentration of the drift layer.

16. The method of claim 14 wherein:
   the doping concentration of the drift layer is between about $6 \times 10^{15}$ cm$^{-3}$ and $1.5 \times 10^{16}$ cm$^{-3}$; and
   the doping concentration of the spreading layer is between about $5 \times 10^{16}$ cm$^{-3}$ and $2 \times 10^{17}$ cm$^{-3}$.

17. The method of claim 15 wherein each one of the first implant region, the second implant region, and the third implant region has a doping concentration between about $5 \times 10^{17}$ cm$^{-3}$ and $1 \times 10^{20}$ cm$^{-3}$.

18. The method of claim 15 wherein the spreading layer comprises multiple layers.

19. The method of claim 18 wherein each layer of the spreading layer has a different doping concentration.

20. The method of claim 19 wherein:
   a first layer of the spreading layer opposite the drift layer has a doping concentration of about $2 \times 10^{17}$ cm$^{-3}$;
   a second layer of the spreading layer adjacent to the drift layer has a doping concentration of about $5 \times 10^{16}$ cm$^{-3}$; and
   a doping concentration of each additional layer of the spreading layer between the first layer and the second layer decreases in proportion to a distance of the additional layer from the first layer, starting at the doping concentration of the first layer, and ending at the doping concentration of the second layer.

21. The method of claim 14 wherein a portion of the spreading layer closest to the drift layer has a doping concentration of about $5 \times 10^{16}$ cm$^{-3}$ that is graduated as the spreading layer extends away from the drift layer to a doping concentration of about $2 \times 10^{17}$ cm$^{-3}$.

22. The method of claim 14 wherein the semiconductor device is a silicon carbide (SiC) device.

23. The method of claim 14 wherein the anode contact comprises a low barrier height Schottky metal.

24. The method of claim 23 wherein the anode contact comprises Tantalum.

25. The method of claim 14 wherein the first implant region and the second implant region are implanted to a depth that is greater than a depth of the first trench.

26. The method of claim 14 wherein the first implant region and the second implant region are provided such that they are in contact with a sidewall of the first trench at least to a depth that is greater than a depth of the gate contact.

* * * * *